(12) United States Patent
Hsu

(10) Patent No.: US 11,137,690 B2
(45) Date of Patent: Oct. 5, 2021

(54) FLOWS OF OPTIMIZATION FOR PATTERNING PROCESSES

(71) Applicant: ASML NETHERLANDS B. V., Veldhoven (NL)

(72) Inventor: Duan-Fu Stephen Hsu, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/649,699

(22) PCT Filed: Oct. 5, 2018

(86) PCT No.: PCT/EP2018/077101
§ 371 (c)(1),
(2) Date: Mar. 23, 2020

(87) PCT Pub. No.: WO2019/072703
PCT Pub. Date: Apr. 18, 2019

(65) Prior Publication Data
US 2020/0257204 A1 Aug. 13, 2020

Related U.S. Application Data

(60) Provisional application No. 62/571,208, filed on Oct. 11, 2017.

(51) Int. Cl.
*G03B 27/54* (2006.01)
*G03F 7/20* (2006.01)
*G03F 1/24* (2012.01)

(52) U.S. Cl.
CPC ............... *G03F 7/705* (2013.01); *G03F 1/24* (2013.01); *G03F 7/70125* (2013.01); *G03F 7/70441* (2013.01)

(58) Field of Classification Search
CPC .... G03F 7/20; G03F 7/70125; G03F 7/70441; G03F 7/705; G03F 1/24; G03F 1/36; G03F 1/70
See application file for complete search history.

(56) References Cited

U.S. PATENT DOCUMENTS

| 6,046,792 A | 4/2000 | Van Der Werf et al. |
| 7,003,758 B2 | 2/2006 | Ye et al. |

(Continued)

FOREIGN PATENT DOCUMENTS

| CN | 102323722 | 1/2012 |
| CN | 103163727 | 6/2013 |

(Continued)

OTHER PUBLICATIONS

International Search Report and Written Opinion issued in corresponding PCT Patent Application No. PCT/EP2018/077101, dated Feb. 20, 2019.

(Continued)

*Primary Examiner* — Peter B Kim
(74) *Attorney, Agent, or Firm* — Pillsbury Winthrop Shaw Pittman LLP

(57) ABSTRACT

A method to improve a lithographic process for imaging a portion of a patterning device pattern onto a substrate using a lithographic projection having an illumination system and projection optics, the method including: (1) obtaining a simulation model that models projection of radiation by the projection optics, wherein the simulation model models an effect of an obscuration in the projection optics, and configuring, based on the model, the portion of the patterning device pattern, and/or (2) obtaining a simulation model that models projection of radiation by the projection optics, wherein the simulation model models an anamorphic demagnification of radiation by the projection optics, and configuring, based on the model, the portion of the pattern- (Continued)

ing device pattern taking into account an anamorphic manufacturing rule or anamorphic manufacturing rule ratio.

19 Claims, 21 Drawing Sheets

(56) References Cited

U.S. PATENT DOCUMENTS

| | | | |
|---|---|---|---|
| 7,587,704 | B2 | 9/2009 | Ye et al. |
| 7,703,069 | B1 | 4/2010 | Liu et al. |
| 8,200,468 | B2 | 6/2012 | Ye et al. |
| 8,584,056 | B2* | 11/2013 | Chen .................. G03F 7/70083 716/53 |
| 2007/0031745 | A1 | 2/2007 | Ye et al. |
| 2007/0050749 | A1 | 3/2007 | Ye et al. |
| 2008/0301620 | A1 | 12/2008 | Ye et al. |
| 2008/0309897 | A1 | 12/2008 | Wong et al. |
| 2010/0162197 | A1 | 6/2010 | Ye et al. |
| 2010/0180251 | A1 | 7/2010 | Ye et al. |
| 2010/0315614 | A1 | 12/2010 | Hansen |
| 2011/0099526 | A1 | 4/2011 | Liu |
| 2015/0378262 | A1 | 12/2015 | Liu et al. |
| 2016/0077426 | A1 | 3/2016 | Jang et al. |
| 2017/0336716 | A1* | 11/2017 | Flagello ............. G03F 7/70033 |

FOREIGN PATENT DOCUMENTS

| | | |
|---|---|---|
| TW | 201729008 | 8/2017 |
| WO | 2010059954 | 5/2010 |

OTHER PUBLICATIONS

Cao. Y. et al.: "Optimized Hardware and Software for Fast, Full Chip Simulation", Proc. of SPIE, vol. 5754 (2005).

Rosenbluth et al.: "Optimum Mask and Source Patterns to Print a Given Shape", Journal of Microlithography, Microfabrication, Microsystems 1(1), pp. 13-20 (2002).

Socha et al. "Simultaneous Source Mask Optimization (SMO)," Proc. of SPIE, vol. 5853, pp. 180-193 (2005).

Hsu, S. et al.: "EUV Resolution Enhancement Techniques (RETs) for k1 0.4 and below", Proc. of SPIE, vol. 9422 (2015).

Van Setten, E. et al.: "Edge Placement Error Control and Mask3D Effects in High-NA Anamorphic EUV Lithography", Proc. of SPIE, vol. 10450 (Oct. 16, 2017).

Spence, C.: "Full-Chip Lithography Simulation and Design Analysis—How OPC Is Changing IC Design", Proc. of SPIE, vol. 5751 (2005).

Clifford, Chris et al.: "Optical Proximity Correction for Anamorphic Extreme Ultraviolet Lithography", Journal of Micro/Nanolithography, MEMS and MOEMS, vol. 16, No. 04, Aug. 19, 2017.

Hsu, S. et al.: "Challenges of Anamorphic High-NA Lithography and Mask Making", Adv. Opt. Techn., 6(3-4), pp. 293-310 (2017).

Kim, In-Seon et al.: "Non-isotropic Shadow Effect with Various Pattern Direction in Anamorphic High NA System", Proc. of SPIE, vol. 9776 (2016).

Kneer B. et al.: "EUV Lithography Optics for Sub 9 nm Resolution", Proc. of Spie, vol. 9422 (2015).

Van Schoot, Jan et al.: "EUV High-NA Scanner and Mask Optimization for Sub 8 nm Resolution", Proc. of SPIE, vol. 9776 (2016).

* cited by examiner

FLOWS OF OPTIMIZATION FOR PATTERNING PROCESSES

CROSS-REFERENCE TO RELATED APPLICATIONS

This application is the U.S. national phase entry of PCT patent application no. PCT/EP2018/077101, which was filed Oct. 5, 2018, which claims the benefit of priority of U.S. patent application No. 62/571,208 which was filed on Oct. 11, 2017, and which is incorporated herein in its entirety by reference.

TECHNICAL FIELD

The description herein relates to patterning apparatuses and processes, and more particularly to a method or tool for optimization of an aspect of a patterning process, such as illumination mode and/or patterning device pattern for use in a lithographic apparatus or process of the patterning process.

BACKGROUND

A lithography apparatus is a machine that applies a desired pattern onto a target portion of a substrate. Lithography apparatus can be used, for example, in the manufacture of devices such as integrated circuits (ICs). In that circumstance, a patterning device (e.g., a mask or a reticle) may be used to generate a pattern corresponding to an individual layer of the device, and this pattern can be transferred onto a target portion (e.g. comprising part of, one or several dies) on a substrate (e.g. a silicon wafer) that has, e.g., a layer of radiation-sensitive material (resist), by methods such as irradiating the target portion via a pattern on the patterning device. In general, a single substrate will contain a plurality of adjacent target portions to which the pattern is successively by the lithographic apparatus, one target portion at a time. In one type of lithographic apparatus, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, a lithographic projection apparatus will have a demagnification factor M (generally >1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference in its entirety.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography can be a central step in the manufacturing of devices such as ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

In an embodiment, there is provided a method to improve a lithographic process for imaging a portion of a patterning device pattern onto a substrate using a lithographic projection apparatus comprising an illumination system and projection optics, the method comprising: obtaining a simulation model that models projection of radiation by the projection optics, wherein the simulation model models an effect of an obscuration in the projection optics; and configuring, based on the model and by a hardware computer, the portion of the patterning device pattern.

In an embodiment, there is provided a method to improve a lithographic process for imaging a portion of a patterning device pattern onto a substrate using a lithographic projection apparatus comprising an illumination system and projection optics, the method comprising: obtaining a simulation model that models projection of radiation by the projection optics, wherein the simulation model models an anamorphic demagnification of radiation by the projection optics; and configuring, based on the model and by a hardware computer, the portion of the patterning device pattern taking into account an anamorphic manufacturing rule or anamorphic manufacturing rule ratio.

In an embodiment, there is provided a computer program product comprising a non-transitory computer readable medium having instructions recorded thereon, the instructions when executed by a computer implementing a method as described herein.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
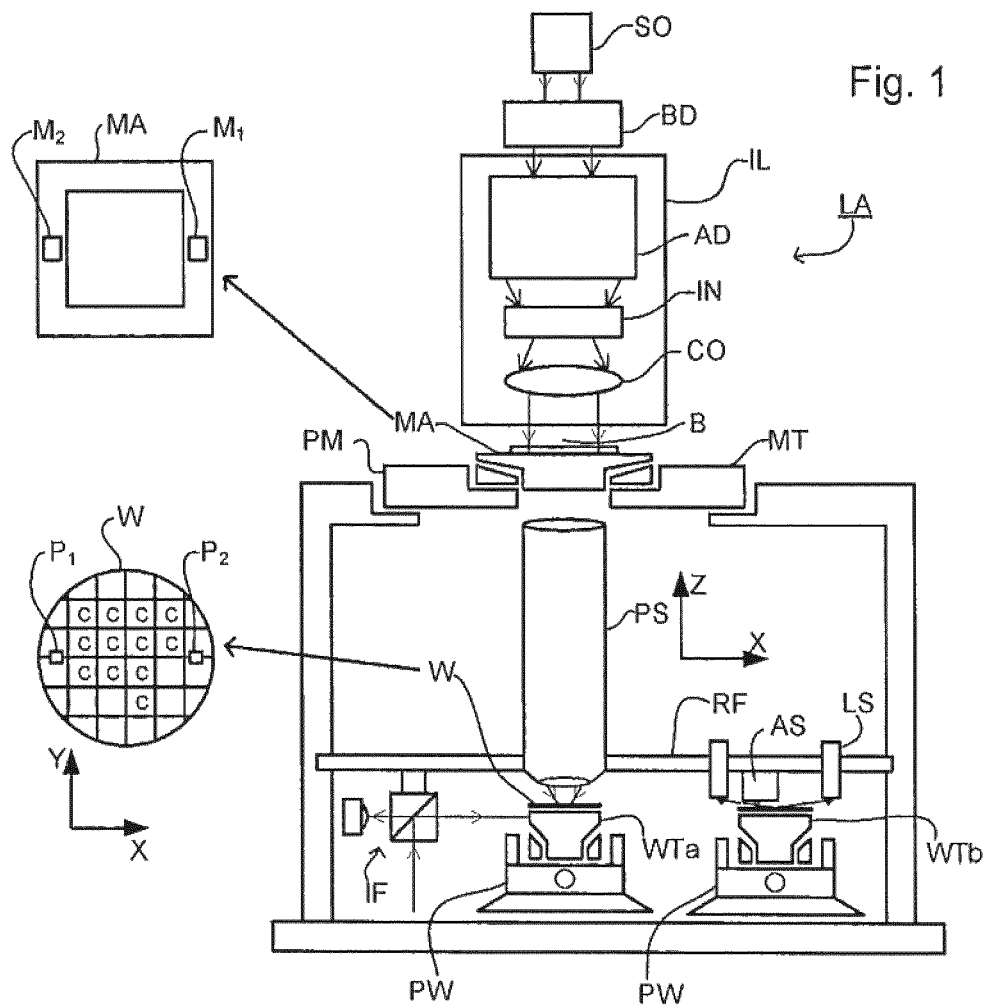
FIG. 1 schematically depicts a lithography apparatus according to an embodiment.

FIG. 1 schematically depicts an exemplary embodiment of a lithographic projection apparatus LA. The apparatus comprises:

an illumination system (illuminator) IL configured to condition a radiation beam B (e.g. electromagnetic radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) constructed to hold a substrate (e.g. a resist coated wafer) W and connected to a second positioner PW configured to accurately position the substrate in accordance with certain parameters; and a projection system (e.g. a refractive, catoptric or catadioptric projection lens system) PS configured to project a pattern imparted to the radiation beam B by patterning device MA onto a target portion C (e.g. comprising one or more dies) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array or LCD matrix, or employing a reflective mask).

The illuminator IL receives a beam of radiation from a radiation source SO (e.g., a mercury lamp or excimer laser). The radiation source and the lithographic apparatus may be separate entities, for example when the radiation source is an excimer laser. In such cases, the radiation source is not considered to form part of the lithographic apparatus and the radiation beam is passed from the radiation source SO to the illuminator IL with the aid of a beam delivery system BD comprising for example suitable directing mirrors and/or a beam expander. In other cases the radiation source may be an integral part of the apparatus, for example when the radiation source is a mercury lamp. The radiation source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term patterning device as employed in this text may be broadly interpreted as referring to a device that can be used to provide, or endow, a radiation beam with a patterned cross-section, corresponding to a pattern that is to be created in a target portion of the substrate. A patterning device may be transmissive or reflective, including binary, phase-shifting, hybrid, etc. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including reflective, refractive, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like location in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like location in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element (such as in ASML's FlexWave™ system). In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the demagnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. In a typical embodiment, an exposure window is used to expose the exposure field, the exposure window being smaller than the patterning device pattern and can be generally in the form of a slit. Sometimes the exposure window is referred to as an exposure slit or scanner exposure slit. For example, the exposure window can be rectangular (e.g., an elongate rectangle) shaped, arc shaped, etc. The exposure window can defined by one or more blades (sometimes referred to as one or more reticle masking (REMA) blades) or by an optical field lens that constrains the radiation to an exposure window.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Various patterns on or provided by a patterning device may have different process windows, i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
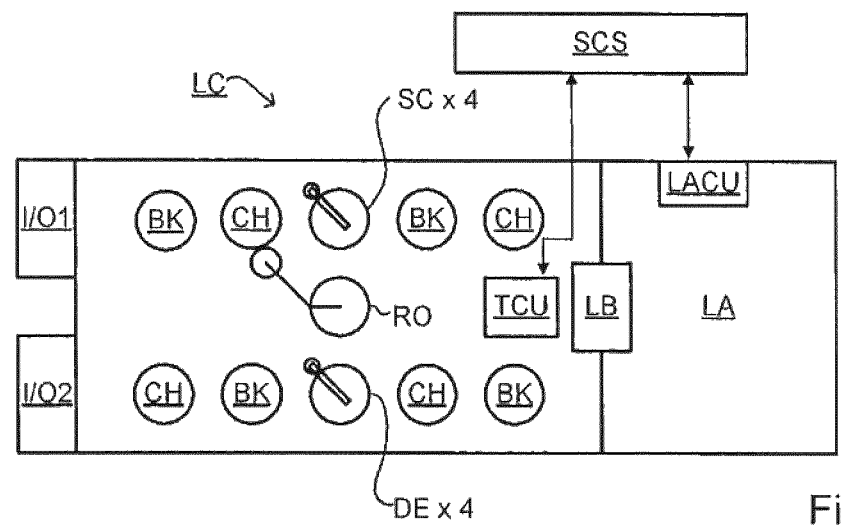
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

As device manufacturing processes used to manufacture devices such as ICs continue to advance, the dimensions of functional elements have continually been reduced while the amount of functional elements, such as transistors, per device has been steadily increasing over decades, following a trend commonly referred to as "Moore's law". To enable this, some processes aim to create patterns at or below the classical resolution limit.

The process in which features with dimensions smaller than the classical resolution limit of a lithographic projection apparatus are printed, is commonly known as low-$k_1$ lithography, according to the resolution formula CD=$k_1 \times \lambda$/NA, where $\lambda$ is the wavelength of radiation employed (e.g., 193 nm or about 13 nm, e.g., about 13.5 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or patterning device pattern. These include, for example, but not limited to, optimization of NA and optical coherence settings, customized illumination schemes, use of phase shifting patterning devices, optical proximity correction (OPC) in the patterning device pattern, or other methods generally defined as "resolution enhancement techniques" (RET).

As an example, OPC addresses the fact that, in addition to any demagnification by the lithographic projection apparatus, the final size and placement of an image of the patterning device pattern projected on the substrate will not be identical to, or simply depend only on the size and placement of, the corresponding patterning device pattern features on the patterning device. It is noted that the terms "mask", "reticle", "patterning device" are utilized interchangeably herein. Also, person skilled in the art will recognize that, especially in the context of lithography simulation/optimization, the terms "mask pattern," "reticle pattern" and "patterning device pattern" can be used interchangeably, as in lithography simulation/optimization, a physical patterning device is not necessarily used but a patterning device pattern can be used to represent a physical patterning device. For the small feature sizes and high feature densities present on some patterning device patterns, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the patterning device pattern is in accordance with requirements of a given target design, proximity effects should be predicted and compensated for, using sophisticated numerical models, corrections or pre-distortions of the patterning device pattern. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the patterning device pattern has some modification in order to achieve high fidelity of the projected image to the target design. These OPC modifications may include shifting or biasing of edge positions or line widths and/or application of "assist" features that are intended to assist projection of other features.

Application of model-based OPC to a target design involves good process models and considerable computational resources, given the many millions of features typically present in a device design. However, applying OPC is generally not an exact science, but an empirical, iterative process that does not always compensate for all possible proximity effects. Therefore, the effect of OPC, e.g., patterning device patterns after application of OPC and any other RET, should be verified by design inspection, e.g., intensive full-chip simulation using calibrated numerical process models, in order to reduce or minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured. Both OPC and full-chip RET verification may be based on numerical modeling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005), which are incorporated herein in their entireties by reference.

One of the simplest forms of OPC is selective bias. Given CD vs. pitch data, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of integrated circuit design and manufacturing is often to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the patterning device pattern. The terms "main feature" and "assist feature" do not imply that a particular feature on a patterning device must be labeled as one or the other.

In addition to, or alternatively to, optimization to patterning device patterns (e.g., OPC), an illumination mode can be optimized, either jointly with patterning device optimization or separately, in an effort to improve the overall lithography fidelity. Many off-axis illumination modes, such as annular, quadrupole, and dipole, have been used, and provide more freedom for OPC design, thereby improving the imaging results, As is known, off-axis illumination is a proven way to resolve fine structures (i.e., target features) contained in the patterning device. However, when compared to a traditional illumination mode, an off-axis illumination mode usually provides less radiation intensity for the aerial image (AI). Thus, it becomes desirable to attempt to optimize the illumination mode to achieve the optimal balance between finer resolution and reduced radiation intensity. Several illumination optimization approaches can be found, for example, in an article by Rosenbluth et al., titled "Optimum Mask and Source Patterns to Print a Given Shape", Journal of Microlithography, Microfabrication, Microsystems 1(1), pp.13-20, (2002), which is incorporated herein in its entirety by reference.

The pressure of ever decreasing design rules drives semiconductor chipmakers to move deeper into low $k_1$ lithography. Lithography towards lower k1 puts heavy demands on RET, exposure tools, and the need for litho-friendly design. So, to help ensure that circuit design can be produced on to the substrate with workable process window, illumination mode—patterning device pattern optimization (referred to in some cases as source-mask optimization or SMO) is becoming a significant RET to achieve, e.g., smaller features.

So, for low $k_1$ photolithography, optimization of both the illumination mode and the patterning device pattern is useful to ensure a viable process window for projection of critical device patterns. Some algorithms (e.g. as described in Socha et al., "Simultaneous Source Mask Optimization (SMO)," Proc. SPIE Vol. 5853, 180-193 (2005), which is incorporated herein in its entirety by reference) discretize illumination into independent illumination distribution points and the patterning device pattern into diffraction orders in the spatial frequency domain, and separately formulate an objective function (which is defined as a function of selected design variables) based on process window metrics such as exposure latitude which could be predicted by optical imaging models from illumination distribution point intensities and patterning device pattern diffraction orders.

A further illumination mode and patterning device pattern optimization method and system that allows for simultaneous optimization of the illumination mode and the patterning device pattern using an objective function without constraints and within a practicable amount of time is described in PCT Patent Application Publication No. WO 2010/059954, titled "Fast Freeform Source and Mask Co-Optimization Method", which is hereby incorporated by reference in its entirety. Another illumination and patterning device optimization method and system that involves optimizing the illumination by adjusting pixels of the illumination distribution is described in U.S. Patent Application Publication No. 2010/0315614, titled "Source-Mask Optimization in Lithographic Apparatus", which is hereby incorporated by reference in its entirety.

Now, the patterning device referred to above can comprise one or more patterning device patterns. The patterning device pattern can be generated utilizing a CAD (computer-aided design) program, this process often being referred to as EDA (electronic design automation). Most CAD programs follow a set of predetermined design rules in order to create functional patterning device patterns for a patterning device. These rules are set by processing and design limitations. For example, design rules define the space tolerance between device features (such as gates, capacitors, etc.) or interconnect lines, so as to ensure that the devices or lines do not interact with one another in an undesirable way. The design rule limitation can be referred to as "critical dimensions" (CD). A critical dimension of a device can be defined as the smallest width of a line or hole or the smallest space between two lines or two holes. Thus, the CD determines the overall size and density of the designed device. One of the goals in integrated circuit fabrication is to faithfully reproduce the original circuit design on the substrate (via the patterning device).

Further, in an optimization process of a system, a figure of merit of the system can be represented as an objective function (e.g., a cost function). The optimization process typically boils down to a process of finding a set of parameters (design variables) of the system that minimizes or maximizes the objective function. The objective function can have any suitable form depending on the goal of the optimization. For example, the objective function can be weighted root mean square (RMS) of deviations of certain characteristics (evaluation points) of the system with respect to the intended values (e.g., ideal values) of these characteristics; the objective function can also be the maximum of these deviations. The term "design variables" as used herein comprises a set of parameters of a patterning process (e.g., of a lithographic process, a lithographic projection apparatus, etc.), for example, parameters that a user of a lithographic projection apparatus can adjust. It should be appreciated that any characteristics of a patterning process, including those of the illumination mode, the patterning device pattern (or the patterning device construction), the projection optics, and/or resist characteristics can be among the design variables in the optimization. The objective function is often a non-linear function of the design variables. Then standard optimization techniques are used to, e.g., minimize or maximize the objective function. The term "evaluation points" herein should be interpreted broadly to include any characteristics of the system or process. The design variables of the system can be confined to finite ranges and/or be interdependent due to practicalities of implementations of the system or process. In case of a lithographic projection apparatus, the constraints are often associated with physical properties and characteristics of the hardware such as tunable ranges, and/or patterning device manufacturability design rules (MRCs), and the evaluation points can include physical points on a resist image on a substrate, as well as non-physical characteristics such as dose and focus.

So, in a lithographic projection apparatus, an illumination system provides illumination (i.e. radiation) to patterning device and projection optics directs the illumination from the patterning device onto a substrate. In an embodiment, the projection optics enables the formation of an aerial image (AI), which is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. In an embodiment, simulation of a lithography process can simulate the production of the aerial image and/or resist image.

Figure 3:
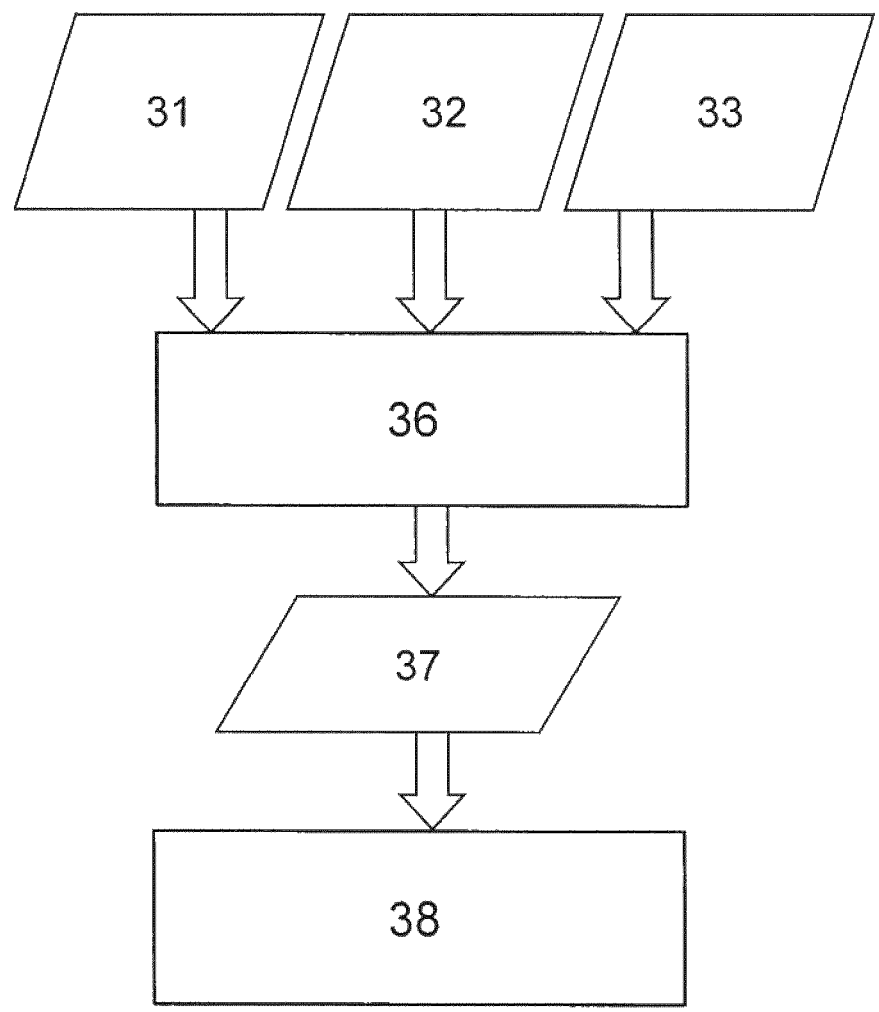
FIG. 3 is a block diagram of simulation models corresponding to the subsystems in FIG. 1.

An exemplary flow chart for simulating lithography in a lithographic projection apparatus is illustrated in FIG. 3. An illumination model 31 represents optical characteristics (including radiation intensity distribution and/or phase distribution) of an illumination mode used to generate a patterned radiation beam. A projection optics model 32 represents optical characteristics (including changes to the radiation intensity distribution and/or the phase distribution caused by the projection optics) of the projection optics. The projection optics model 32 may include optical aberrations caused by various factors, for example, heating of the components of the projection optics, stress caused by mechanical connections of the components of the projection optics, etc. The illumination model 31 and the projection optics model 32 can be combined into a transmission cross coefficient (TCC) model. A patterning device pattern model 33 represents optical characteristics (including changes to the radiation intensity distribution and/or the phase distribution caused by a given patterning device pattern) of a patterning device pattern, which is the representation of an arrangement of features of a patterning device. An aerial image 36 can be simulated from the illumination model 31, the projection optics model 32 and the patterning device pattern model 33. A resist image 38 can be simulated from the aerial image 36 using a resist model 37. Simulation of lithography can, for example, predict contours, CDs and/or pattern shift in the resist image.

The illumination model 31 can represent the optical characteristics of the illumination system that include, but not limited to, NA-sigma ($\sigma$) settings as well as any particular illumination mode shape (e.g. off-axis radiation illumination modes such as annular, quadrupole, dipole, etc.). The projection optics model 32 can represent the optical characteristics of the projection optics, including one or more selected from: an aberration, a distortion, a refractive index, a physical size, a physical dimension, an absorption, etc. Optical properties of the lithographic projection apparatus (e.g., properties of the illumination, the patterning device pattern and the projection optics) dictate the aerial image. Since the patterning device pattern used in the lithographic projection apparatus can be changed, it is desirable to separate the optical properties of the patterning device pattern from the optical properties of the rest of the lithographic projection apparatus including at least the illumination and the projection optics.

The patterning device pattern model 33 can represent physical properties of a physical patterning device and a patterning device pattern, as described, for example, in U.S. Pat. No. 7,587,704, which is incorporated by reference in its entirety.

The resist model 37 can be used to calculate the resist image from the aerial image. An example of such a resist model can be found in U.S. Pat. No. 8,200,468, which is hereby incorporated by reference in its entirety. The resist model is typically related only to properties of the resist layer (e.g., effects of chemical processes which occur during exposure, post-exposure bake (PEB) and development).

The objective of the simulation is to accurately predict, for example, edge placements and/or CDs, which can then be compared against an intended design. The intended design is generally defined as a pre-OPC patterning device pattern which can be provided in a standardized digital file format such as GDSII or OASIS or other file format.

Details of techniques and models used to transform a patterning device pattern into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, 2010-0180251 and 2011-0099526, the disclosure of each which is hereby incorporated by reference in its entirety.

From the patterning device pattern, one or more portions may be identified, which are referred to as "clips." In a specific embodiment, a set of clips is extracted, which represents the complicated patterns in the patterning device pattern (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the patterning device pattern or may be similar or have a similar behavior of portions of the patterning device pattern where critical features are identified either by experience (including clips provided by a customer), by trial and error, or by running a full-chip simulation. Clips usually contain one or more test patterns or gauge patterns. An initial larger set of clips may be provided a priori by a customer based on known critical feature areas in a patterning device pattern which require particular image optimization. Alternatively, in another embodiment, the initial larger set of clips may be extracted from the entire patterning device pattern by using some kind of automated (such as, machine vision) or manual algorithm that identifies the critical feature areas.

In one or more embodiments, optimization can be performed using an objective function, such as $$CF(z_1, z_2, \ldots, z_N) = \sum_{p=1}^{P} w_p f_p^2(z_1, z_2, \ldots, z_N) \quad (1)$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, or any point on a patterning device pattern, or resist image, or aerial image.

The objective function may represent any suitable characteristics of the lithographic projection apparatus or the substrate, for instance, focus, CD, image shift, image distortion, image rotation, etc. For example, the objective function may be a function of one or more of the following lithographic metrics: edge placement error, critical dimension, resist contour distance, worst defect size, pattern shift, stochastic effect, three-dimensional effect of the patterning device, three-dimensional effect of the resist, best focus shift, pupil fill factor, exposure time, and/or throughput. Since it is the resist image that often dictates the pattern on a substrate, the objective function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the illumination mode, the patterning device pattern, the projection optics, dose, focus, etc.

The lithographic apparatus may include one or more components collectively called a "wavefront manipulator" that can be used to adjust shapes of a wavefront and intensity distribution and/or phase shift of the radiation beam. The wavefront and intensity distribution can be adjusted at any location along an optical path of the lithographic projection apparatus, such as before the patterning device, near a pupil plane, near an image plane, or near a focal plane. The projection optics can be used to correct or compensate for certain distortions of the wavefront and intensity distribution caused by, for example, the illumination, the patterning device, temperature variation in the lithographic projection apparatus, and/or thermal expansion of components of the lithographic projection apparatus. Adjusting the wavefront and intensity distribution can change values of the evaluation points and the objective function. Such changes can be simulated from a model or actually measured.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, for example, minimizing the weighted RMS of $f_p(z_1, z_2, \ldots, z_N)$ is equivalent to minimizing the objective function $CF(z_1, z_2, \ldots, z_N) = \sum_{p=1}^{P} w_p f_p^2(z_1, z_2, \ldots, z_N)$, defined in Eq. 1. Thus the weighted RMS of $f_p(z_1, z_2, \ldots, z_N)$ and Eq. 1 may be utilized interchangeably for notational simplicity herein.

Further, if the process window (PW) is maximized, it is possible to consider the same physical location from different PW conditions as different evaluation points in the objective function in Eq. 1. For example, if N PW conditions are considered, then the evaluation points can be categorized according to their PW conditions and the objective functions can be written as:

$$CF(z_1, z_2, \ldots, z_N) = \sum_{p=1}^{P} w_p f_p^2(z_1, z_2, \ldots, z_N) = \sum_{u=1}^{U}\sum_{p_u} w_{p_u} f_{p_u}^2(z_1, z_2, \ldots, z_N) \quad (2)$$

where $f_{p_u}(z_1, z_2, \ldots, z_N)$ is a function of the difference between an actual value and an intended value of the $p_u$-th evaluation point for a set of values of the design variables of $(z_1, z_2, \ldots, z_N)$ under the u-th PW condition u=1, \ldots, U. When this difference is the edge placement error (EPE), then minimizing the above objective function is equivalent to minimizing the edge shift under various PW conditions, thus this leads to maximizing the PW. In particular, if the PW also includes different patterning device bias, then minimizing the above objective function also includes the minimization of mask error enhancement factor (MEEF), which is defined as the ratio between the substrate EPE and the induced patterning device pattern feature edge bias.

The design variables may have constraints, which can be expressed as $(z_1, z_2, \ldots, z_N) \in Z$, where Z is a set of possible values of the design variables. The constraints may represent, e.g., physical restrictions in a hardware implementation of the lithographic projection apparatus. The constraints may include one or more selected from: a tuning range, a rules governing patterning device manufacturability (MRC), and/or interdependence between two or more design variables.

The optimization process therefore is to find a set of values of the design variables, under the constraints $(z_1, z_2, \ldots, z_N) \in Z$, that, e.g., minimize the objective function, i.e., to find $$(\tilde{z}_1, \tilde{z}_2, \ldots, \tilde{z}_N) = \arg\min_{(z_1, z_2, \ldots, z_N) \in Z} CF(z_1, z_2, \ldots, z_N) =$$

$$\arg\min_{(z_1, z_2, \ldots, z_N) \in Z} \sum_{p=1}^{P} w_p f_p^2(z_1, z_2, \ldots, z_N)$$

Figure 4:
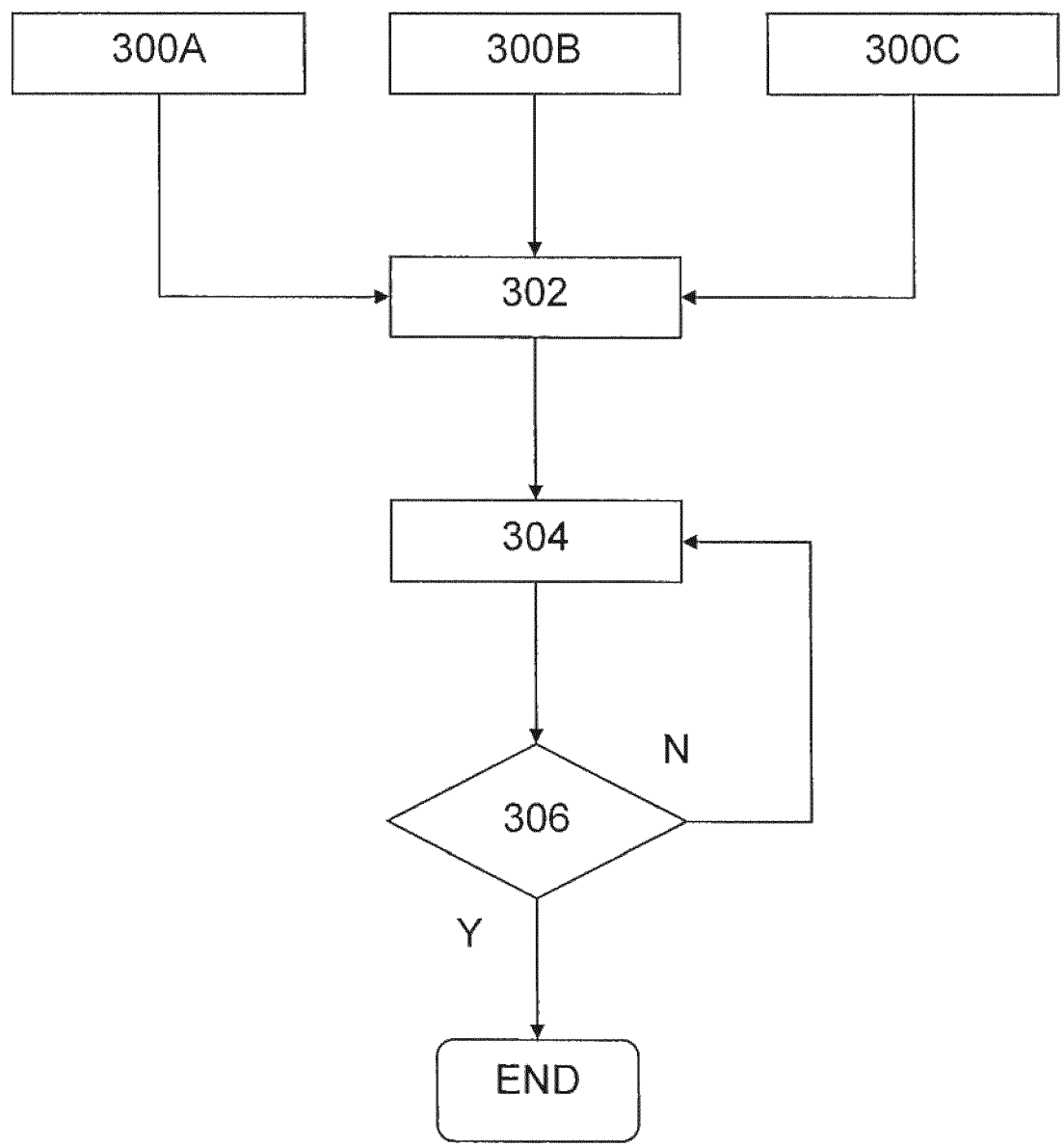
FIG. 4 shows a flow chart of a general method of optimizing the lithography projection apparatus.

A general method of optimizing the lithography projection apparatus, according to an embodiment, is illustrated in FIG. 4. This method comprises a step 302 of defining a multi-variable objective function of a plurality of design variables. The design variables may comprise any suitable combination selected from: one or more characteristics of the illumination mode (300A) (e.g., pupil fill ratio, namely percentage of radiation of the illumination that passes through a pupil or aperture), one or more characteristics of the projection optics (300B) and/or one or more characteristics of the patterning device pattern (300C). For example, the design variables may include characteristics of the illumination mode (300A) and characteristics of the patterning device pattern (300C) (e.g., global bias) but not characteristics of the projection optics (300B), which leads to a SMO. Alternatively, the design variables may include characteristics of the illumination mode (300A), characteristics of the projection optics (300B) and characteristics of the patterning device pattern (300C), which leads to an optimization of the illumination, the patterning device pattern and the projection optics (sometimes referred to as a source-mask-lens optimization (SMLO)). In step 304, the design variables are simultaneously adjusted so that the objective function is moved towards convergence. In step 306, it is determined whether a predefined termination condition is satisfied. The predetermined termination condition may include various possibilities, e.g., the objective function may be minimized or maximized, as required by the numerical technique used, the value of the objective function is equal to a threshold value or has crossed the threshold value, the value of the objective function has reached within a preset error limit, and/or a preset number of iterations of the objective function evaluation is reached. If a termination condition in step 306 is satisfied, the method ends. If the termination condition in step 306 is not satisfied, the steps 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In an embodiment, instead of, or in addition to, calculating and/or determining the effect on the optical characteristics of the illumination system and/or projection optics, it is envisioned that adjustable optical characteristics of the illumination system and/or projection optics can be included in the design variables. Exemplary adjustable optical characteristics may include one or more lens manipulators, temperature data or a signal associated with temperature data of one or more devices, e.g. a heater, utilized to control the temperature of an optical element of the illumination system and/or projection system, one or more Zernike coefficients, etc. The SMO or SMLO procedure can then be carried out and the design variables, including the adjustable optical characteristics, can be simultaneously adjusted so that the objective function is moved towards convergence.

In FIG. 4, the optimization of all the design variables is executed simultaneously. Such flow may be called the simultaneous optimization, joint optimization, or co-optimization. The terms "simultaneous", "simultaneously", "joint" and "jointly" as used herein mean that the design variables of the characteristics of the illumination mode, patterning device, projection optics and/or any other design variables, are allowed to change at the same time.

Figure 5:
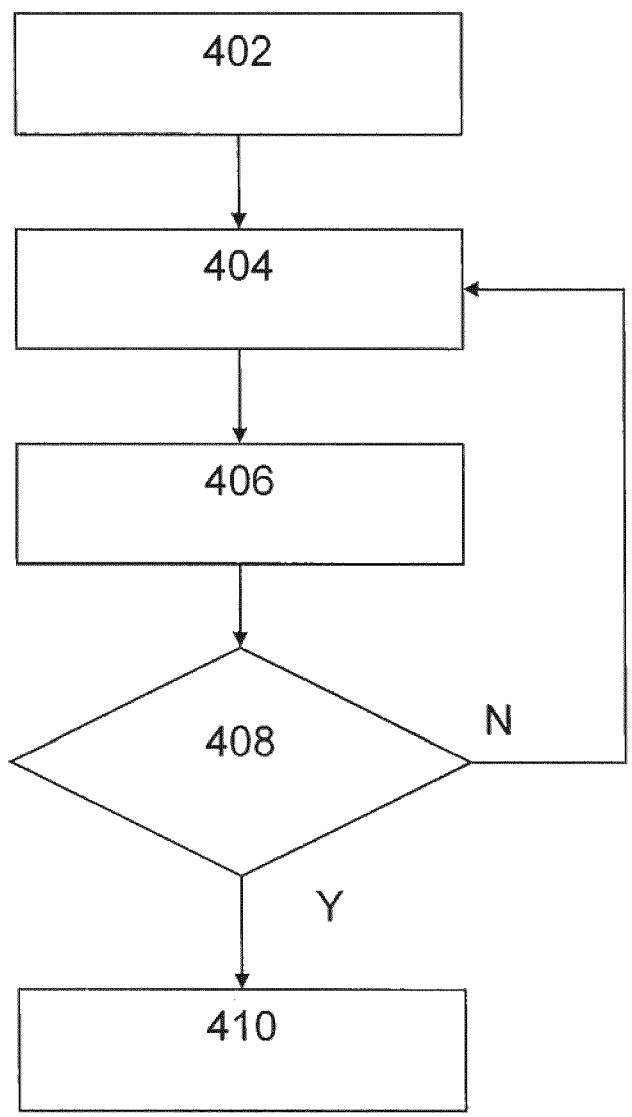
FIG. 5 shows a flow chart of a method of optimizing the lithography projection apparatus where the optimization of all the design variables is executed alternately.

Alternatively, the optimization of all the design variables is executed alternately, as illustrated in FIG. 5. In this flow, in each step, some design variables are fixed while the other design variables are optimized as part of evaluation of the objective function; then in the next step, a different set of variables are fixed while the others are optimized as part of evaluation of the objective function. These steps are executed alternately until convergence or certain terminating conditions are met. As shown in the non-limiting example flowchart of FIG. 5, first, a patterning device pattern (step 402) is obtained, then a step of illumination mode optimization is executed in step 404, where all the design variables of the illumination mode are optimized (SO) as part of evaluation of a suitable objective function while all the other design variables are fixed. Then in the next step 406, a mask optimization (MO) is performed, where all the design variables of the patterning device are optimized as part of evaluation of a suitable objective function while all the other design variables are fixed. These two steps are executed alternately, until certain terminating conditions are met in step 408. Various termination conditions can be used, such as, the value of the objective function becomes equal to a threshold value, the value of the objective function crosses the threshold value, the value of the objective function reaches within a preset error limit, or a preset number of iterations of evaluation of the objective function is reached, etc. Note that SO-MO-Alternate-Optimization is used as an example for the alternative flow. The alternate flow can take many different forms, such as SO-LO-MO-Alternate-Optimization, where SO, LO (Lens Optimization) is executed, and MO alternately and iteratively; or first SMO can be executed once, then execute LO and MO alternately and iteratively; and so on. Finally the output of the optimization result is obtained in step 410, and the process stops.

The pattern selection algorithm, as discussed before, may be integrated with the simultaneous or alternate optimization. For example, when an alternate optimization is adopted, first a full-chip SO can be performed, the 'hot spots' and/or 'warm spots' are identified, then a MO is performed. In view of the present disclosure numerous permutations and combinations of sub-optimizations are possible in order to achieve the desired optimization results.

Figure 6:
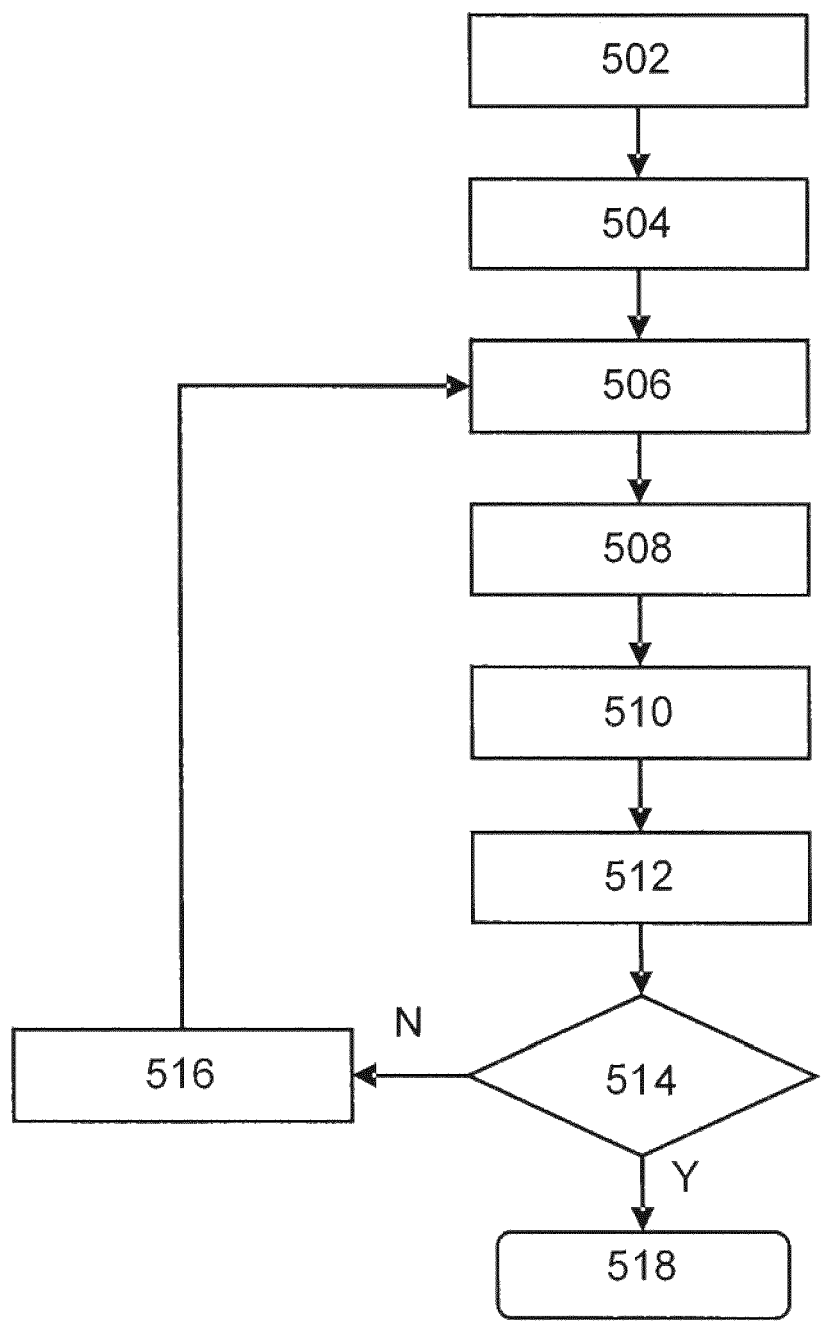
FIG. 6 shows one exemplary method of optimization.

FIG. 6 shows one exemplary method of optimization, where an objective function is defined and evaluated. In step 502, initial values of design variables are obtained, including their tuning ranges, if any. In step 504, the multi-variable objective function is set up. In step 506, the objective function is expanded within a small enough neighborhood around the starting point value of the design variables for the first iterative step (i=0). In step 508, standard multi-variable optimization techniques are applied to minimize or maximize the objective function. Note that the optimization can have constraints, such as tuning ranges, during the optimization process in 508 or at a later stage in the optimization process. Each iteration is evaluated using given test patterns (also known as "gauges") for the identified evaluation points that have been selected to optimize the lithographic process. In step 510, a lithographic response (e.g., one or more certain characteristics of an aerial image, one or more certain characteristics of a resist image, or one or more certain characteristics of the lithographic process such as the process window) is predicted. In step 512, the result of step 510 is compared with a desired or ideal lithographic response value. If the termination condition is satisfied in step 514, i.e. the optimization generates a lithographic response value sufficiently close to the desired value, and then the final value of the design variables is outputted in step 518. The output step may also include outputting other functions using the final values of the design variables, such as outputting a wavefront aberration-adjusted map at the pupil plane (or other planes), an optimized illumination mode map, an optimized patterning device pattern (e.g., including optical proximity corrections), etc. If the termination condition is not satisfied, then in step 516, the values of the design variables is updated with the result of the i-th iteration, and the process goes back to step 506. An algorithm, such as the Gauss-Newton algorithm, the Levenberg-Marquardt algorithm, the gradient descent algorithm, simulated annealing, the genetic algorithm, etc. can be applied to evaluate and solve the objective function.

Optimizing a patterning process can expand the process window. A larger process window provides more flexibility in process design and device design. The process window can be defined as a set of focus and dose values for which the resist image are within a certain limit of the design target of the resist image. Note that all the methods discussed here may also be extended to a generalized process window definition that can be established by different or additional base parameters in addition to or other than exposure dose and defocus. These may include, but are not limited to, optical settings such as NA, optical sigma, optical aberrations, polarization, or optical constants of the resist layer. For example, as described earlier, if the PW also involves different mask bias, then the optimization can include the minimization of MEEF. The process window defined on focus and dose values only serve as an example in this disclosure.

A method of maximizing the process window, according to an embodiment, is described below. In a first step, starting from a known condition $(f_0, \varepsilon_0)$ in the process window, wherein $f_0$ is a nominal focus and $\varepsilon_0$ is a nominal dose, there is performed minimization of one of the example objective functions below in the vicinity $(f_0 \pm \Delta f, \varepsilon_0 \pm \varepsilon)$:

$$CF(z_1, z_2, \ldots, z_N, f_0, \varepsilon_0) = \min_{(f,\varepsilon)=(f_0 \pm \Delta f, \varepsilon_0 \pm \varepsilon)} \max_p |f_p(z_1, z_2, \ldots, z_N, f, \varepsilon)| \quad (4)$$

or $$CF(z_1, z_2, \ldots, z_N, f_0, \varepsilon_0) = \min\left(\max\left(\sum_{(f,\varepsilon)=(f_0 \pm \Delta f, \varepsilon_0 \pm \varepsilon)} \sum_p w_p f_p^2(z_1, z_2, \ldots, z_N, f, \varepsilon)\right)\right) \quad (5)$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the objective function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the objective function is within a preset limit.

The methods described earlier in this disclosure can be used to minimize the respective objective functions of equation (4) or (5). If the design variables are characteristics of the projection optics, such as the Zernike coefficients, then minimizing the objective functions of equation (4) or (5) leads to process window maximization based on projection optics optimization, i.e., LO. If the design variables are characteristics of the illumination mode and patterning device pattern in addition to those of the projection optics, then minimizing the objective function of equation (4) or (5) leads to process window maximizing based on SMLO. If the design variables are characteristics of the illumination mode and the patterning device pattern, then minimizing the objective functions of equation (4) or (5) leads to process window maximization based on SMO.

The optimization described above may be used to find a set of values of $(z_1, z_2, \ldots, z_N)$ to reduce many physical effects that may be adverse to the lithographic process. Multiple optimizations may be conducted in series for different physical effects, on different components of the lithographic apparatus, and under different conditions. Some of the effects, components, and conditions may be unique in lithography using EUV.

One of the effects, components, and conditions that may be unique to lithography using EUV is obscuration when using relatively high numerical aperture projection optics in an EUV lithographic projection apparatus. Standard EUV coatings used for reflective element of a EUV projection system are not able to reflect the combination of large radiation incident angles and a large radiation angular spread needed for high NA EUV optics (i.e., NA being larger than about 0.33). Therefore, a high NA EUV projection system, a part of which is shown in FIG. 7A, would have relatively low transmission.

Figure 7A:
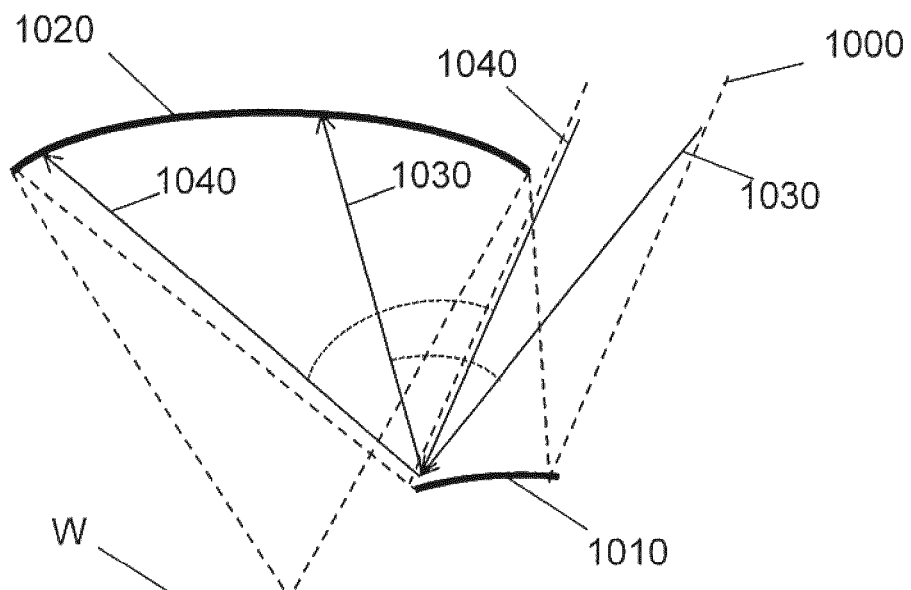
FIG. 7A schematically depicts a portion of a projection system according to an embodiment.
Figure 7A:
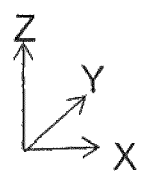

As seen in schematic FIG. 7A, a beam 1000 (whose outer boundary is denoted by the dashed lines) is incident on a reflective element 1010 of an EUV projection system and reflected toward reflective element 1020, which projects the radiation toward a substrate W. As seen in the portion of an EUV projection system as depicted in FIG. 7A, the incident radiation on the substrate W would desirably have relatively high incident angles and a large angular spread. However, as can be seen on reflective element 1020, at least some of the radiation incident thereon would have relatively larger incidence angles. For example, rays 1030 and 1040 are example rays within the beam 1000 and it can be seen that, for example, ray 1040 will have a relatively large incident angle on reflective element 1020 and moreover there is quite a wide angular spread between rays 1030 and 1040 when incident on reflective element 1020. But, with higher NA, incident angles and angular spread increase, but it has been discovered that an EUV mirror coating can only effectively handle a small range of angles. That is, at relatively larger incident angles, the reflectivity of the multilayer structures of EUV reflective elements drops off significantly. So, a high NA EUV projection system having the form of FIG. 7A may not be feasible in terms of transmission.

Therefore, to provide relatively high transmission, the incident angles and angular spread should be kept relatively low on the reflective elements of a high NA EUV optics. So, an alternative imaging optics design can be provided to keep the incident angles and angular spread relatively low and yield a higher NA at the substrate level, but as a consequence of that design an obscuration may be provided in the pupil.

So, despite having this obscuration, this alternative optics design can yield a high NA like the design of FIG. 7A but enable significantly smaller angles and angular spread on the projection optics, which leads to transmission gain. Indeed, for a high NA system (i.e., a NA higher than about 0.33) with an obscuration, a transmission gain may be realized versus a lower NA system (i.e., a system with NA less than or equal to about 0.33).

Figure 7B:
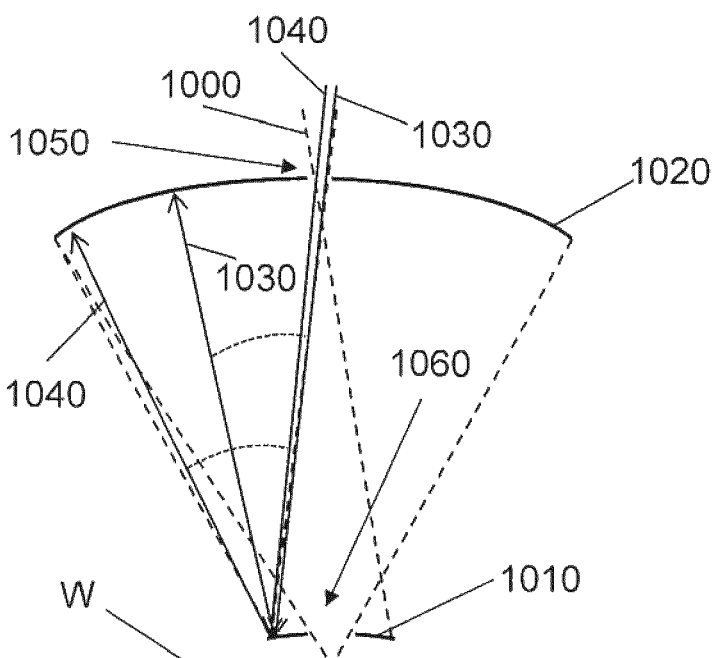
FIG. 7B schematically depicts a portion of a projection system according to a further embodiment.
Figure 7C:
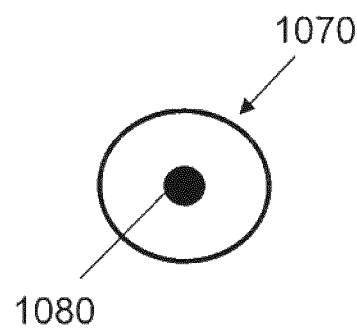
FIG. 7C schematically depicts a pupil corresponding to the system of FIG. 7B.

An embodiment of part of such an alternative optics design is schematically depicted in FIG. 7B. A beam 1000 (whose outer boundary is denoted by the dashed lines) passes through an opening or spacing 1050 within a reflective element 1020 (where reflective element 1020 is a unitary body) or adjacent a plurality of reflective elements 1020 (where there are a plurality of reflective elements 1020 adjacent to each other) of an EUV projection system toward one or more reflective elements 1010, which reflect the radiation back toward one or more reflective elements 1020. The one or more reflective elements 1020 then reflect the radiation toward substrate W, which in this case is through an opening or spacing 1060 within a reflective element 1010 (where reflective element 1010 is a unitary body) or adjacent a plurality of reflective elements 1010 (where there are a plurality of reflective elements 1010 adjacent to each other). As seen in the portion of an EUV projection system as depicted in FIG. 7B, the incident radiation on the substrate W would desirably have relatively high incident angles and a large angular spread comparable to FIG. 7A. However, as can be seen on reflective element(s) 1010 and/or 1020, the radiation incident thereon would have relatively low incidence angles (compared to, e.g., the system of FIG. 7A). For example, rays 1030 and 1040 are example rays within the beam 1000 and it can be seen that, for example, both rays 1030 and 1040 have a relatively low incident angle on reflective element 1010 and 1020 and moreover there is quite a narrow angular spread between rays 1030 and 1040 when incident on reflective elements 1010 and 1020. But, as will be evident, a relatively small portion of the radiation from the beam 1000 will be lost through opening or spacing 1050 when the radiation is reflected from the reflective element 1010(s) toward reflective element(s) 1020. Thus, opening or spacing 1050 creates an obscuration in the projection pupil. An example of the obscuration is depicted in FIG. 7C, which shows a pupil 1070 with an obscuration 1080. In this embodiment, the opening or spacing 1050 is circular and thus yields a circular obscuration 1080. But the opening/spacing and/or obscuration can be any shape (e.g., it does not need to be circular). In an embodiment, the obscuration 1080 is in a central portion of the pupil.

So, with an obscured projection optics, the maximum incident angles (e.g., rays 1030 and 1040) on the reflective element (s) 1020 as well as the angular spread are reduced compared to an unobscured projection optics, which increases the system transmission. For example, with obscured projection optics, the maximum incident angles as well as the spread of the incident angles on reflective element(s) 1020 can be reduced to ~50% of an unobscured projection optics.

Figure 8:
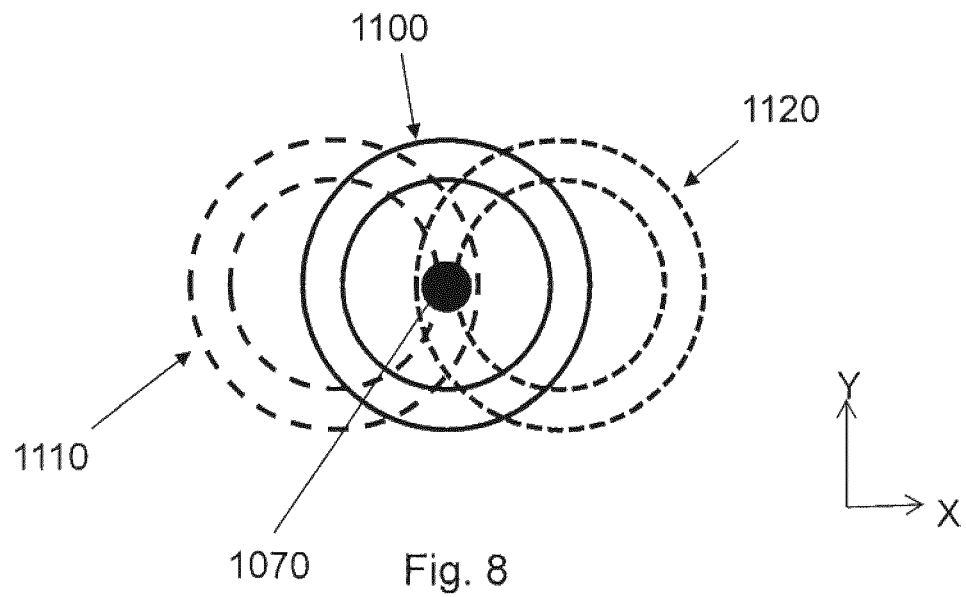
FIG. 8 schematically depicts diffraction orders from a patterning device pattern that are partially obscured by an obscuration from a projection system such as depicted in FIG. 7B.

But, an obscuration blocks the transmission of a certain range of the diffraction radiation through the projection optics. So, obscuration in the pupil can cause contrast loss because of the inability of a certain portion of the generated diffraction orders to interfere with each other. Referring to FIG. 8, the diffraction orders in a projection system pupil that are produced from diffraction of a patterning device pattern are schematically depicted. Zeroth orders are depicted by solid circles 1100, $\pm 1^{st}$ diffraction orders are depicted by longer dash circles 1110, and further $\pm 1^{st}$ diffraction orders are depicted by shorter dash circles 1120. As will be appreciated, there can be other diffraction orders; it is just the $0^{th}$, $+1^{st}$ and $-1^{st}$ orders that are highly schematically depicted here for convenience. As seen in FIG. 8, the obscuration 1070 in the pupil will block parts of the $0^{th}$, $+1^{st}$ and $-1^{st}$ orders and in particular prevent at least part of the $+1^{st}$ and $-1^{st}$ orders from interfering at the substrate for image formation. That is, there will be a certain amount less of $+1^{st}$ and $-1^{st}$ order radiation that will interfere at the substrate than would otherwise without the obscuration 1070. Thus, there will be a certain amount of contrast loss. Moreover, that contrast loss can be dependent on the patterning device pattern feature, in particular, in an embodiment, dependent on the pitch of the patterning device pattern features. For example, for a NA of about 0.55, obscuration can block all or part of the diffraction orders for patterning pattern feature pitches selected from 25 nm to 44 nm, which will lead to contrast loss for those pitches in particular.

Figure 9:
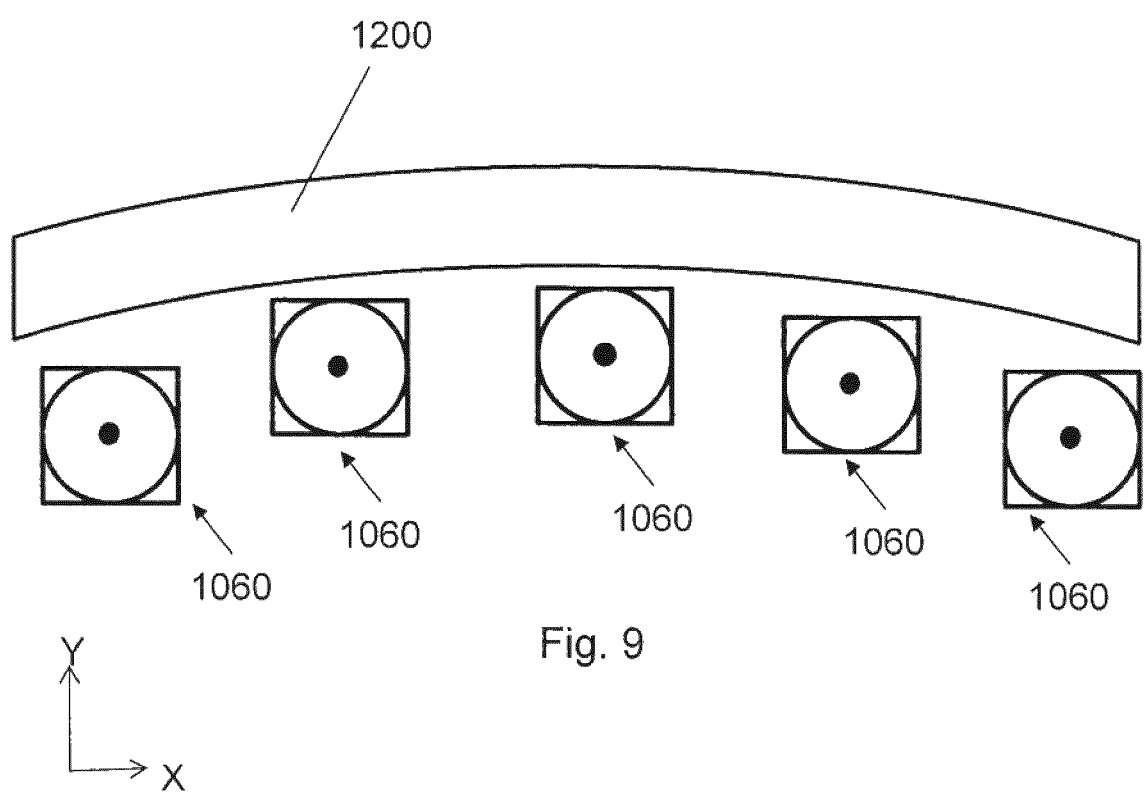
FIG. 9 schematically depicts variation in the pupil of an obscuration of a projection system as a function of position across an exposure window.
Figure 10:
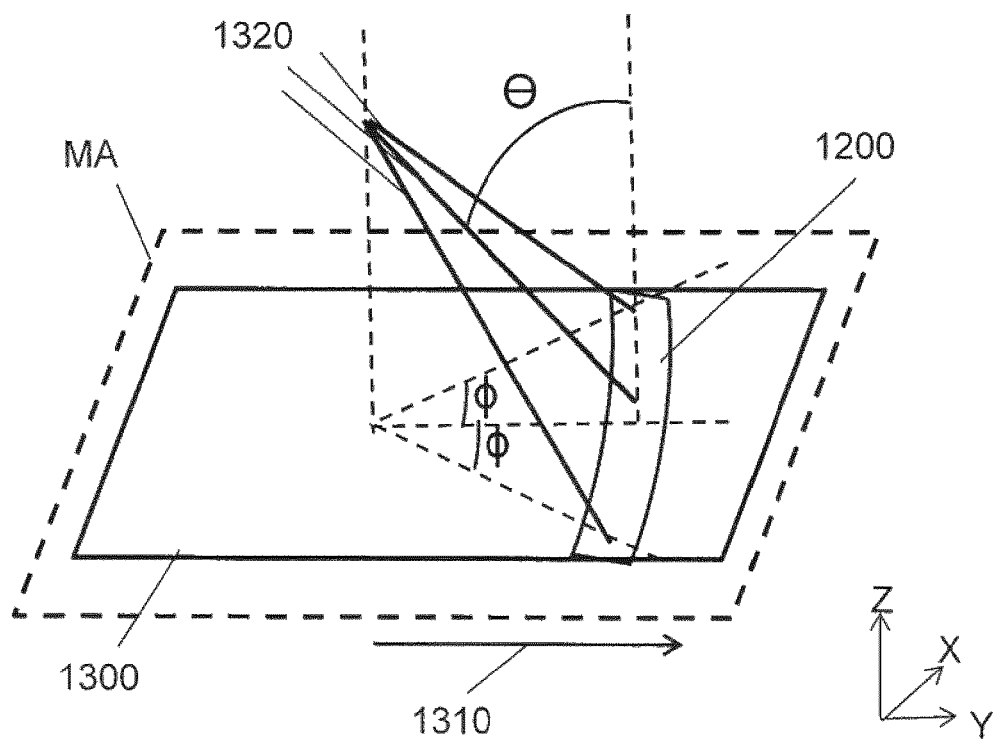
FIG. 10 schematically depicts illumination of an exposure field on a patterning device pattern using an exposure window at a non-zero CRAO.

Moreover, the effective obscuration in the pupil can vary as a function of position across an exposure window due to a difference in incident angle of the radiation at the patterning device pattern in an exposure window. This can be seen in FIG. 10 described hereafter, wherein the CRAO identified as θ is generally the same across the exposure window in the X and Y directions and will generally be the same for each of a plurality of rays at different angles emanating from a point-like location as shown in FIG. 10. That is, in an embodiment, the polar angle is about the same for each ray. But, those rays will have a significantly different azimuthal angle φ and so will interact differently with the obscuration in the projection optics. Accordingly, FIG. 9 schematically depicts variation in the pupil of an obscuration of a projection system as a function of position across an exposure window. The obscured pupils 1060 as "seen" through the exposure window from the substrate level will vary across the exposure window in a direction at an angle (e.g., perpendicular) to the scanning direction. A function can be defined to describe the variation in the obscured pupils across the exposure window at angle to the scanning direction.

Another one of the effects, components, and conditions that may be unique to lithography using EUV is use of an illumination mode that is provided with a chief ray at a non-zero incident angle to the patterning device. As will be appreciated, to avoid interference between incoming and outgoing radiation, the radiation provided to a reflective patterning device would be a non-zero incident angle. For example, an EUV lithographic projection apparatus may have a chief ray at an angle incident on the patterning device (chief ray angle at object (CRAO)) other than at 0 degrees, e.g., in the range of 1 to 15 degrees, e.g., selected from the range of about 4-8 degrees (such as about 6 degrees), which can lead to complicated projection optics involving anamorphic demagnification. Further, radiation with a CRAO at the patterning device may lead to shadowing and pattern shift when applied to a patterning device having a topography in and/or out of the plane of the patterning device pattern at the patterning device (referred to as patterning device 3D or mask 3D). The pattern shift may be pattern-dependent and/or exposure window position-dependent. FIG. 10 schematically depicts illumination of an exposure field on a patterning device pattern using an exposure window at a non-zero CRAO. In a practical implementation of an EUV patterning device, the view in FIG. 10 is a bottom view of the patterning device MA when located in place in an EUV lithographic apparatus and further the patterning device MA when in place in the EUV lithographic apparatus may at a tilt to level (which tilt is not shown in FIG. 10). Now, as seen in FIG. 10, there is depicted a relative movement between a portion of the patterning device MA corresponding to the exposure field 1300 and the exposure window 1200 in a scanning direction 1310. Typically, the patterning device MA is moved relative to the exposure window 1200 but that need not be the case. The net effect of the relative movement is that the exposure window 1200 effectively scans the exposure field 1300 to enable transfer of the patterning device pattern located therein toward the projection optics and the substrate. Part of the radiation 1320 that forms the exposure window 1200 is shown. Since, in this case, the patterning device MA is reflective and that radiation 1320 has a non-zero CRAO denoted by θ. As discussed above, for each ray forming the exposure window 1200, the CRAO is generally the same across the exposure window in the X and Y directions even for rays at different azimuthal angle ϕ. But, the rays forming the exposure window 1200 and emanating from a particular point-like location will have significantly different azimuthal angles, which can yield differing effects across the exposure window 1200 in a direction transverse to the scanning direction 1310. One such differing effect can be the effective obscuration in the pupil for particular radiation depending on the location in the exposure window 1200 of that radiation. Other effects can be patterning device 3D effects that can depend on the differing angle of the radiation across the exposure window 1200.

Another one of the effects, components, and conditions that may be unique to lithography using EUV is anamorphic demagnification. For ease of reading, the term demagnification will be used herein to refer to the reduction in size from the patterning device level to the substrate level. As will be appreciated, any demagnification can be characterized as a magnification at a fraction. For example, in a typical DUV lithographic projection apparatus, the demagnification is isomorphic, i.e., substantially the same in the various different directions in a plane perpendicular to the optical axis. In an EUV lithographic projection apparatus, the projection optics may have anamorphic demagnification (i.e., varying demagnification for patterning device pattern features in different orientations in a plane perpendicular to an optical axis of the projection optics) because of the use of primarily reflective optical components in combination with EUV radiation. For example, where the plane is spanned by X and Y directions, the demagnification can be different in the X direction (which can be labeled as a horizontal direction) than in the Y direction (which can be labelled as a vertical direction), which can contribute to a difference (astigmatism) in the size of features in the X/horizontal and Y/vertical directions (which is sometimes referred to as horizontal-vertical bias or H-V bias). For example, the demagnification in the X/horizontal direction can be 4 while the demagnification in the Y/vertical direction can be 8. So, while a square polygon of a patterning device pattern with isomorphic demagnification would yield a smaller substantially square polygon at the substrate, a patterning device feature in an anamorphic demagnification system would need to be modified into an elongate rectangle at the patterning device pattern in order to yield the same smaller substantially square polygon at the substrate as in an isomorphic demagnification system.

Figures 11A, 11B:
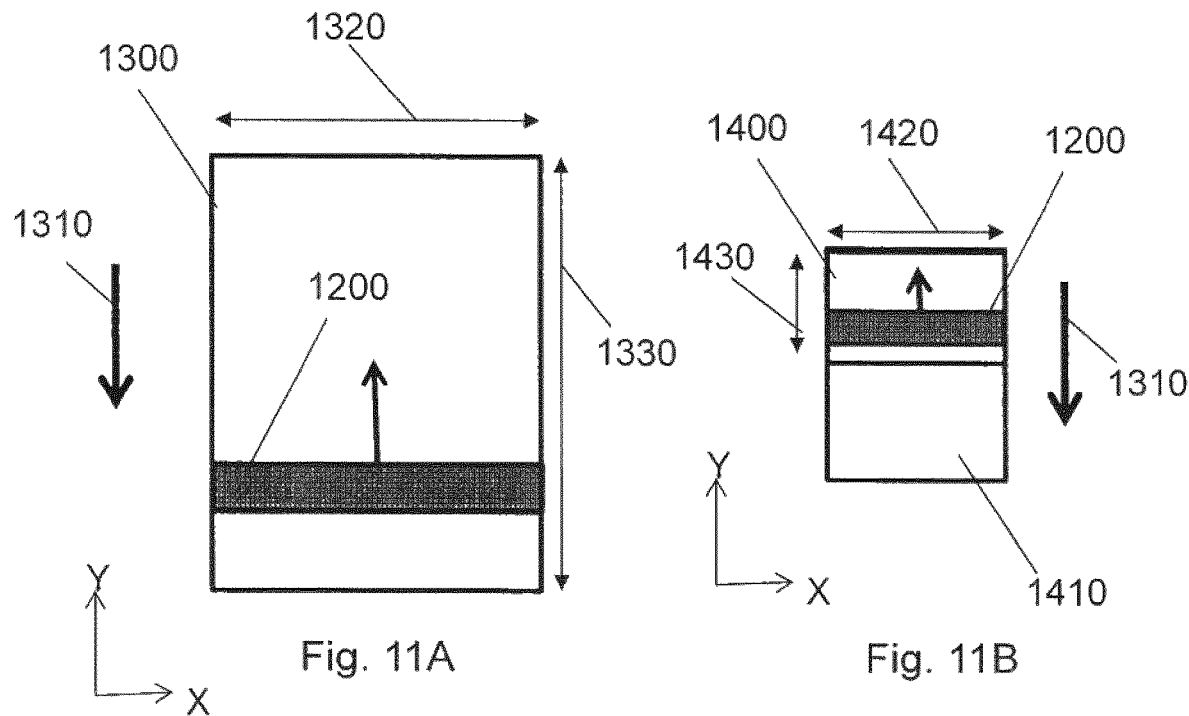
FIG. 11A schematically depicts an exposure field at a patterning device in conjunction with an exposure window used to transfer the exposure field to the substrate.
FIG. 11B schematically depicts the exposure field of FIG. 11A at the substrate as a consequence of a projection system having anamorphic demagnification.

Implications of this anamorphic demagnification are shown in FIGS. 11A and 11B. FIG. 11A shows an exposure field 1300 at a patterning device, along with an exposure window 1200 being effectively scanned across the exposure field 1300 due to, in this case, scanning motion by the patterning device in the scanning direction 1310 relative to the essential fixed in location exposure window 1200. The width 1320 and the length 1330 of the exposure field are also shown. If it is desired to produce a traditional 26 mm width and 33 mm length field at the substrate using an isomorphic demagnification of 4 (which is common in the industry), then the width 1320 would 104 mm and the length 1330 would be 132 nm. This patterning device field size could then also be standard in the industry.

FIG. 11B shows the effect of anamorphic demagnification in the context of the patterning device field of FIG. 11A. That is, FIG. 11B schematically depicts the exposure field of FIG. 11A at the substrate as a consequence of a projection system having anamorphic demagnification. FIG. 11B shows an exposure field 1400 at the substrate along with the exposure window 1200 (which would be shrunk according to the anamorphic demagnification) being effectively scanned across the exposure field 1400 due to, in this case, scanning motion by the substrate in the scanning direction 1310 relative to the essential fixed in location exposure window 1200. Scanning direction 1310 at the substrate could be in a different, opposite direction depending on image reversal characteristics of the projection system. The width 1420 and the length 1430 of the exposure field 1400 are also shown. In this case, the anamorphic demagnification can be demagnification in the X/horizontal (H) direction of 4 and demagnification in the Y/vertical (V) direction of 8. The result of such an anamorphic demagnification would be, where the exposure field 1300 has a traditional width 1320 of 104 mm and length 1330 of 132 nm, an exposure field 1400 of width 1420 of 26 mm (i.e., a typical substrate field width) but a length 1430 of 16.5 nm (i.e., half of a typical substrate field length). Thus, this anamorphic demagnification of H:V of 4:8 yields an exposure field 1400 of effectively a half of a traditional exposure field; of course, a different ratio would occur depending on the anamorphic demagnification value. So, to obtain a traditional exposure field, two half-fields could be exposed, namely exposure field 1400 and exposure field 1410, with anamorphic demagnification of H:V of 4:8 to yield a traditional exposure field with an isomorphic demagnification of 4. So, exposure field 1300 would be exposed twice to yield exposure fields 1400 and 1410 and the exposure fields 1400 and 1410 would be stitched together using one or more lithographic stitching techniques.

So, these various issues arising from differences between an EUV lithographic projection apparatus and a DUV lithographic projection apparatus can call for one or more new flow of optimizations. But, these issues are not unique to EUV lithographic projection apparatuses (and may occur in DUV lithographic projection apparatus) and so the flows disclosed herein are not limited to use in an EUV lithographic projection apparatus. The new flows of optimization desirably reduce, for example, H-V bias, Bossung tilt, sensitivity to flare, pattern shift and/or contrast loss due to patterning device 3D, anamorphic demagnification, and/or projection optics obscuration.

Figure 12:
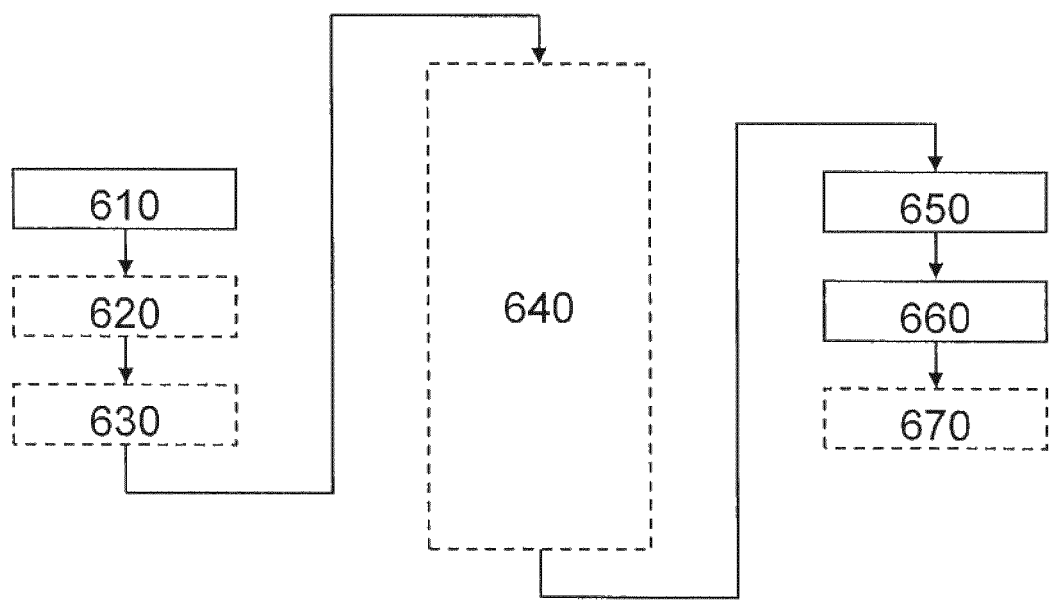
FIG. 12 shows a flow of an optimization according to an embodiment.

FIG. 12 shows a flow of an optimization according to an embodiment. The flow starts at 610 with obtaining an illumination mode shape (which may be represented by an intensity and/or phase distribution at a plane below the illumination system, such as the pupil plane) and a patterning device defocus value (a global shift of the patterning device along the optical axis of the projection optics). The illumination mode shape and patterning device defocus value may be selected or measured using any suitable method, such as those illustrated in FIG. 13 and FIG. 14.

In optional step 620, the patterning device pattern is optimized as a continuous transmission mask ("CTM optimization"). In this optimization, the transmission at all the locations of the patterning device pattern is not restricted to a number of discrete values. Instead, the transmission may assume any value within an upper bound and a lower bound. More details may be found in U.S. Pat. No. 8,584,056, the disclosure of which is hereby incorporated by reference in its entirety. A continuous transmission mask is difficult, if not impossible, to implement as a patterning device. However, it is a useful tool because not restricting the transmission to a number of discrete values makes the optimization much faster. In an EUV lithographic projection apparatus, the patterning device may be reflective. The principle of CTM optimization is also applicable to a patterning device pattern to be produced on a reflective patterning device, where the reflectivity at all the locations of the patterning device pattern is not restricted to a number of discrete values. Therefore, as used herein, the term "continuous transmission mask" may refer to a patterning device pattern to be produced on a reflective patterning device or a transmissive patterning device and transmission is synonymous with, e.g., reflectivity in this context.

In optional step 630, assist features (sub resolution assist features and/or printable resolution assist features) may be placed into the patterning device pattern based on the patterning device pattern optimized as a continuous transmission mask in step 620. This step allows for identification and design of the assist feature from the continuous transmission mask.

In optional step 640, a model of the illumination mode, the patterning device pattern and the projection optics is obtained. This step will be explained in further detail below. In an embodiment, the model can calculate an aerial image by using Abbe formulas. Desirably, the model can calculate an aerial image by using Hopkins' formulas. The Hopkins' formulas use a transmission function of the illumination mode and the projection optics. The transmission function may be expanded into Zernike (or similar) polynomials. The model is used to simulate the imaging of the projection system of patterning device pattern. For example, the model may be used to simulate an aerial image produced by the illumination mode, the patterning device pattern and the projection optics. The model may include sub-models for the illumination mode, the patterning device pattern and the projection optics, respectively.

In step 650, the dose of the lithographic process may be optimized by using the model obtained in optional step 640.

In step 660, the patterning device pattern may be optimized for each of a number of exposure window positions of the illumination mode. In an EUV lithographic apparatus, the through exposure window optical aberration tends to vary with positions within an exposure window (e.g., varying along a direction along the length of a slit type exposure window). The exposure window optical aberration may be due to many effects such as substrate defocus, dose drift, patterning device feature dimension change, heating, etc. This step allows compensation for the exposure window optical aberration. For example, an objective function that measures evaluation points under a range of exposure window positions may be used in this step.

In optional step 670, a process window is determined for each of the exposure window positions.

Figure 13:
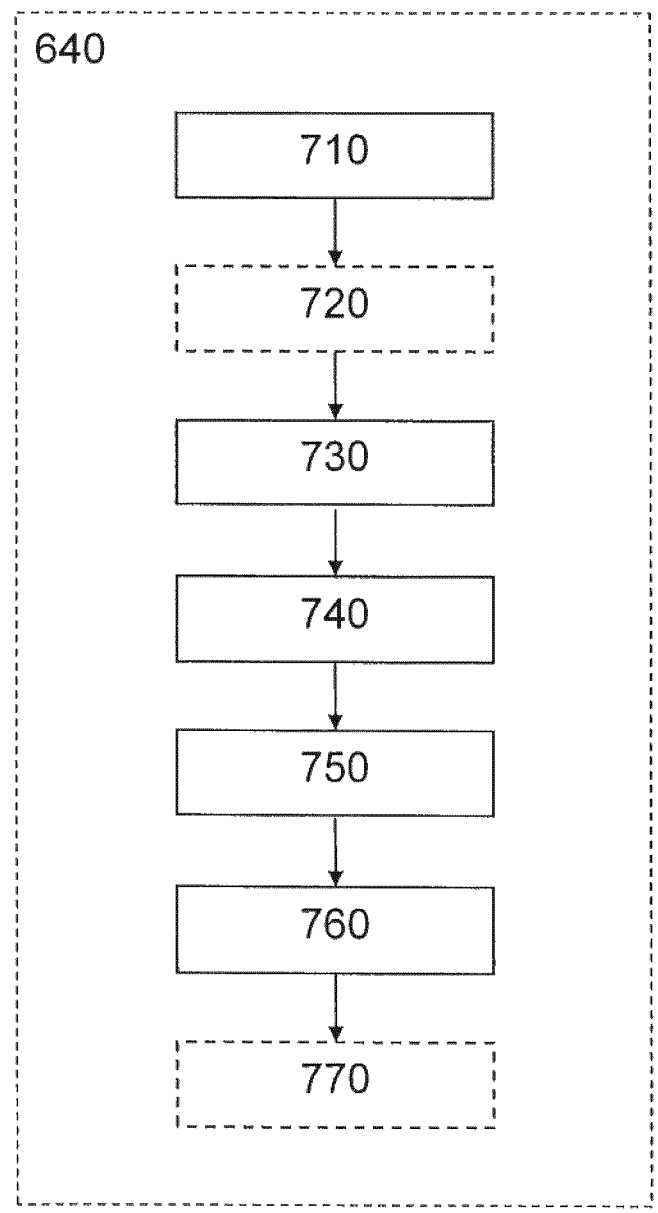
FIG. 13 shows details of step 640, according to an embodiment.

FIG. 13 shows details of an embodiment of step 640. In step 710, under the assumption that the illumination mode is a freeform illumination mode, the illumination mode and the patterning device pattern may be optimized using a patterning device 3D model. A freeform illumination mode means that the intensity at the pupil plane is not limited to a number of discrete values and the configuration of the illumination mode is not particularly constrained. Assuming that the illumination mode is a freeform illumination mode makes this optimization much faster. As noted above, a patterning device may have a topography in a third dimension in or out of a plane of the patterning device pattern. This three-dimensionality means that the patterning device is treated not merely as a "thin mask" but rather as a "thick mask." So, the patterning device 3D model takes in account "thick mask" effects. The "thick mask" effects arise from the vector nature of radiation and may be significant when feature sizes on the patterning device pattern are smaller than the wavelength of radiation used in the lithographic process and/or when the radiation is has a non-zero CRAO. The "thick mask" effects can include polarization dependence due to the different boundary conditions for the electric and magnetic fields, include transmission, reflectance and/or phase error in small openings, edge diffraction (or scattering) effects, shadowing effects, and/or electromagnetic coupling. More details of a patterning device 3D model can be found in U.S. Pat. No. 7,703,069, the disclosure of which is hereby incorporated by reference in its entirety.

In optional step 720, the patterning device defocus is optimized using the illumination mode and patterning device pattern optimized in step 710. This step allows for adjustment of the patterning device defocus to accommodate changes to the illumination mode and patterning device pattern caused by the optimization in step 710. For example, the patterning device defocus can be a design variable. An objective function may be, e.g., minimized to find the patterning device defocus.

In step 730, a plane of best focus of the aerial image at the substrate formed by the illumination mode and the patterning device pattern as optimized in step 710 is determined. For example, the best focus can be a design variable. An objective function may be, e.g., minimized to find the best focus.

In step 740, the freeform illumination mode is mapped to a discrete illumination mode. The freeform illumination mode may not be directly renderable with certain hardware. So, an initial discrete pupil profile resembling the pupil profile of the freeform illumination mode and renderable by hardware of the illumination mode (e.g., renderable by the array of mirrors) is calculated using any suitable method based on the pupil profile of the freeform illumination mode. So, for example, the illumination mode used in a lithographic projection apparatus may be a discrete illumination mode (e.g., rendered by an array of mirrors having discrete reflective states).

In step 750, the dose of the lithographic process may be optimized. This step allows for compensation for dose change due to the mapping of the freeform illumination mode to the discrete illumination mode.

Traditional technology uses optical material structures called diffractive optical elements (DOEs) to shape the radiation to form a desired illumination mode. For complex pupil profiles, these DOEs have to be custom designed and manufactured. ASML's FlexRay™ system uses a programmable array of individually adjustable mirrors. It can create almost any pupil profile in a matter of minutes—eliminating the long cycle time associated with DOE design and fabrication. Although the number of the adjustable mirrors may be as large as several hundred, they are still spatially discrete. In some lithographic projection systems, the mirrors are not continuously adjustable, namely each mirror can be in several (e.g., 2-10) discrete states. Due to the discrete nature of the mirrors, the pupil profile actually rendered using the array of mirrors resembles but may still substantially deviate from the pupil profile of the freeform illumination mode. This deviation tends to be greater in an EUV illumination mode. This deviation may be reduced if the discrete nature of the mirrors is taken into account when the illumination mode is optimized. However, traditional discrete optimization (e.g., branch-and-bound algorithm) is computationally costly (with run time increasing exponentially with the number of mirrors), namely $O(a^n)$, wherein a is constant and n is the number of mirrors. In step 760, the patterning device pattern and the discrete illumination mode are optimized, according to a method that may reduce the computational cost to be proportional to the number of mirrors, namely $O(n)$. This method may include: selecting a discrete change to the current discrete pupil profile and applying the selected change to the current discrete pupil profile, where the current discrete pupil profile with the selected discrete change becomes the current discrete profile in the next iteration; optimizing, with the pupil profile fixed, design variables unassociated to illumination hardware (e.g., such illumination hardware may include the mirrors) that causes discrete change in the discrete pupil profile (e.g., one or more design variables associated with the patterning device pattern, the dose, etc.), wherein these design variables could include discrete and/or continuous design variables; and iterating these steps until an end condition is satisfied. More details may be found in U.S. Patent Application Publication No. US 2015-0378262, the disclosure of which is hereby incorporated by reference in its entirety.

In optional step 770, the projection optics may be optimized. For example, the wavefront may be adjusted, by using, for example, ASML's FlexWave™ system. This step allows for adjustment of the projection optics to accommodate the discrete illumination mode and the patterning device pattern optimized in step 760. For example, an objective function that is a function of one or more design variables characterizing the projection optics may be used in this optimization.

Figure 14:
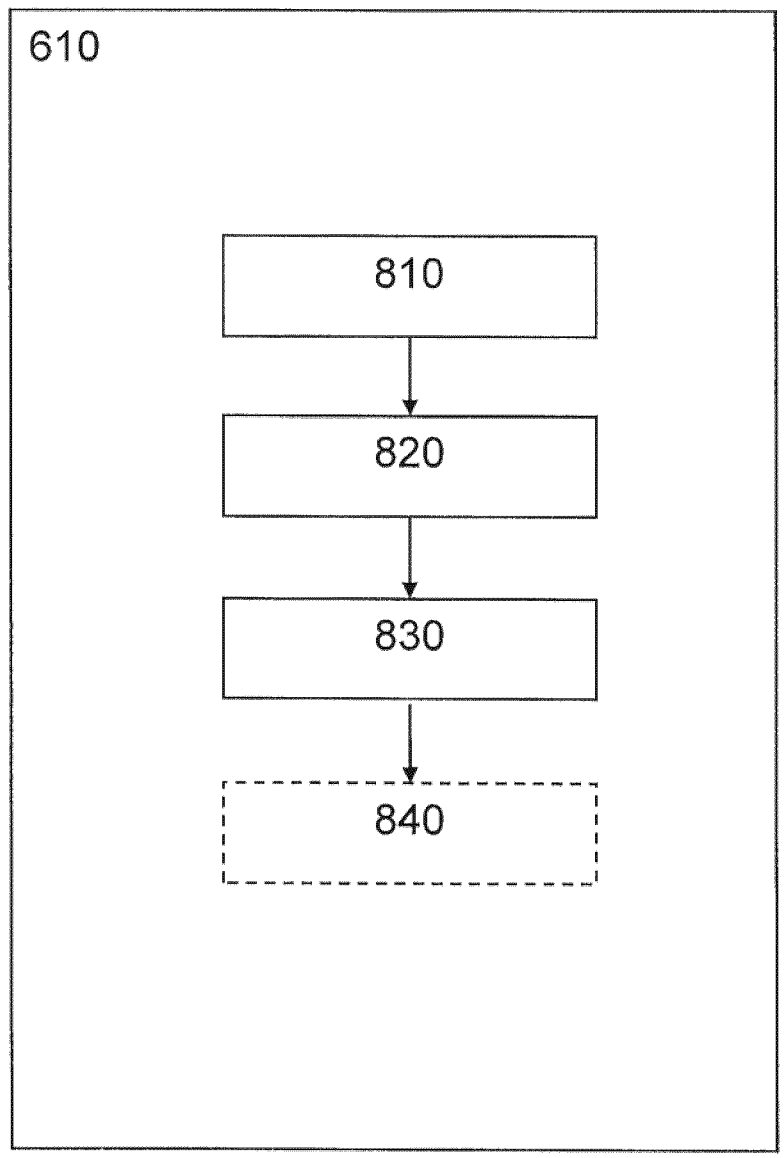
FIG. 14 shows details of step 610, according to an embodiment.

FIG. 14 shows details of step 610, according to an embodiment. In step 810, an initial value of the patterning device defocus and an initial illumination mode shape (e.g., a ring shape) is obtained. The patterning device defocus may be weakly dependent on the illumination mode. Therefore, the initial value of the patterning device defocus and the initial illumination mode shape need not be particularly selected. In step 820, under the assumption that the illumination mode is a freeform illumination mode shape, the illumination mode and the patterning device pattern may be optimized using a "thin mask" model. A "thin mask" model does not take into account "thick mask" effects and thus tends to be faster than a patterning device 3D model. In step 830, the dose of the lithographic process may be optimized with the "thick mask" effects taken into account. This step allows for compensation for changes in the dose from the "thin mask" model to the "thick mask" model. In optional step 840, the patterning device defocus is optimized for the optimized illumination mode in step 820, although the patterning device defocus may only weakly depend on the illumination mode. The method in FIG. 14 may be effective to reduce "thick mask" effects and pattern shift.

Figure 15:
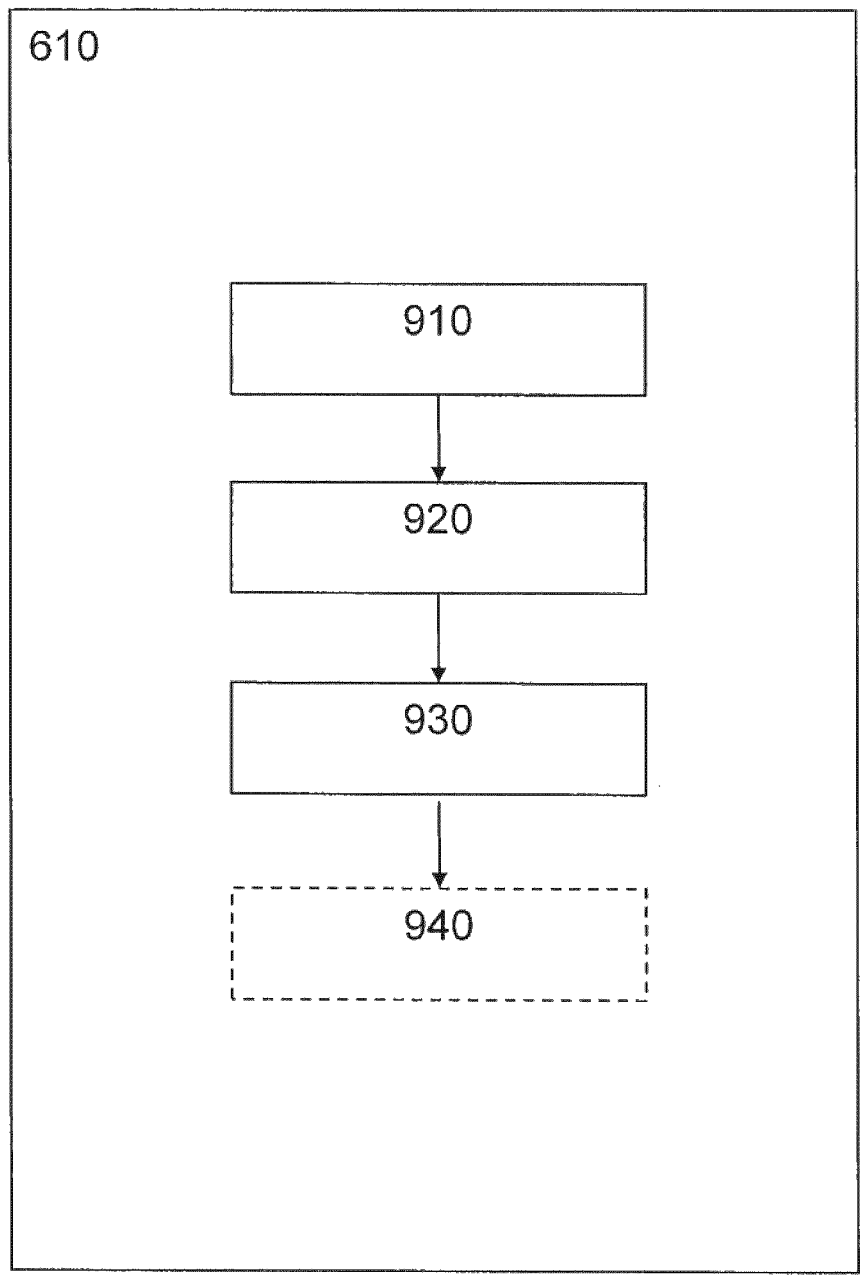
FIG. 15 shows details of step 610, according to an embodiment.

FIG. 15 shows details of step 610, according to a further embodiment. Compared to the method in FIG. 14, the method in FIG. 15 can be computationally faster. The patterning device defocus may be weakly dependent on the illumination mode. Therefore, a method for obtaining the patterning device defocus may be based on averaging several patterning device defocus values determined using several pupil profiles (e.g., quasi-conventional, large annular, small annular, x-dipole, y-dipole, quasar, and c-quad). In step 910, an initial value of the patterning device defocus is obtained. In step 920, several patterning device defocus values are determined using several pupil profiles and the initial value of the patterning device defocus. In step 930, the patterning device defocus value of step 610 is obtained by averaging the several patterning device defocus values. In optional step 940, a plane of best focus of an aerial image at the substrate formed by the illumination mode, the portion of the patterning device pattern and the projection optics is determined.

So, in an embodiment, there is provided a method to improve a lithographic process for imaging a portion of a patterning device pattern onto a substrate using a lithographic projection apparatus comprising an illumination system and projection optics, the method comprising: obtaining an illumination mode shape and a patterning device defocus value; optimizing a dose of the lithographic process; and optimizing the portion of the patterning device pattern for each of a plurality of exposure window positions of the illumination mode. In an embodiment, the method further comprises optimizing the patterning device pattern wherein transmission at all locations of the portion of the patterning device pattern is not restricted to a number of discrete values. In an embodiment, the method further comprises obtaining a model of the illumination mode of the illumination system, a model of the portion of the patterning device pattern, a model of the projection optics, or a combination thereof, wherein the one or more models are configured to simulate an aerial image produced by the illumination mode, the portion of the patterning device pattern and the projection optics. In an embodiment, optimizing the dose of the lithographic process comprises using at least one of the models. In an embodiment, the method further comprises determining for each of the exposure window positions, a process window. In an embodiment, obtaining the one or more models comprises optimizing the illumination mode and the portion of the patterning device pattern using a three-dimensional patterning device model, under an assumption that the illumination mode shape is a freeform shape. In an embodiment, obtaining the one or more models further comprises determining a plane of best focus of an aerial image formed by the illumination mode and the portion of the patterning device pattern optimized using the three-dimensional patterning device model. In an embodiment, obtaining the one or more models further comprises mapping the freeform illumination shape to a discrete illumination mode shape. In an embodiment, obtaining the one or more models further comprises optimizing the portion of the patterning device pattern and the discrete illumination mode shape. In an embodiment, obtaining the one or more models further comprises optimizing the projection optics. In an embodiment, obtaining the illumination mode shape and the patterning device defocus value comprises obtaining an initial value of patterning device defocus. In an embodiment, obtaining the illumination mode shape and the patterning device defocus value further comprises optimizing the illumination mode and the portion of the patterning device pattern using a thin patterning device model, wherein the illumination mode shape is a freeform illumination mode shape. In an embodiment, obtaining the illumination mode shape and the patterning device defocus value further comprises optimizing the patterning device defocus by using a three-dimensional patterning device model. In an embodiment, obtaining the illumination mode shape and the patterning device defocus value comprises determining a plurality of patterning device defocus values using a plurality of pupil profiles. In an embodiment, obtaining the illumination mode shape and the patterning device defocus value comprises averaging several patterning device defocus values. In an embodiment, obtaining the illumination mode shape and the patterning device defocus value comprises determining a plane of best focus of an aerial image formed by the illumination mode, the portion of the patterning device pattern and the projection optics.

To address projection optics obscuration and/or anamorphic demagnification, there are provided one or more flows of an optimization according to an embodiment. In prior optimization methods, the flows for, e.g., EUV lithographic process optimization did not appear to consider the presence of an obscuration of a projection system or in combination with a possible anamorphic demagnification of such a projection system. Accordingly, as will be discussed further herein, in an embodiment, an optimization flow incorporates a simulation model that accounts for an obscuration in a projection system. For example, by incorporating a simulation model that accounts for an obscuration in a projection system, a patterning device pattern and/or an illumination mode can be configured to more accurately produce a desired pattern at the substrate, to yield smaller features in a pattern at the substrate than otherwise, etc.

Additionally, prior optimization techniques seem to only consider isomorphic patterning device manufacturing rule checks (MRC), i.e., rules that are the same in any direction within a patterning device pattern plane. And, this is the case for projection systems having anamorphic demagnification. But, it has been discovered that an anamorphic patterning device manufacturing rule, e.g., a rule that allows dimensions associated with main features and/or sub-resolution assist features in a larger demagnification direction (e.g., scanning direction) to be different than the smaller demagnification direction (e.g., the direction along the length of an exposure window) can advantageously provide more flexibility for the optimization of, e.g., a patterning device pattern and/or an illumination mode to allow more accurate production of a desired pattern at the substrate, to yield smaller features in a pattern at the substrate than otherwise, etc.

In an embodiment, the optimization can involve a source-mask optimization (SMO). In an embodiment, the optimization can involve a mask optimization (MO). In an embodiment, the optimization can involve a illumination mode optimization (SO). As will be appreciated, an optimization of the projection system in conjunction with the SMO or MO (either in a simultaneous manner or in alternative fashion) can be performed.

Now, the optimization flow can address an aspect of anamorphic demagnification, can address projection optics obscuration, or both. The flows will be primarily described in terms of addressing both an aspect of anamorphic demagnification and projection optics obscuration, but either can be omitted from the flow if desired. Moreover, the optimization flow that addresses an aspect of anamorphic demagnification and/or projection optics obscuration can be combined with any of the prior disclosed flows relating to patterning device defocus optimization, discrete mirror state optimization and/or through exposure window patterning device pattern variation as part of an optimization flow. For example, an optimization flow that addresses an aspect of anamorphic demagnification and/or projection optics obscuration can be added to or included within a patterning device defocus optimization, discrete mirror state optimization and/or through exposure window patterning device pattern variation as part of an optimization flow. Furthermore, any combination selected from the various considerations— patterning device defocus optimization, discrete mirror state optimization, through exposure window patterning device pattern variation as part of an optimization flow, anamorphic demagnification, and/or projection optics obscuration—can be used.

Figure 16:
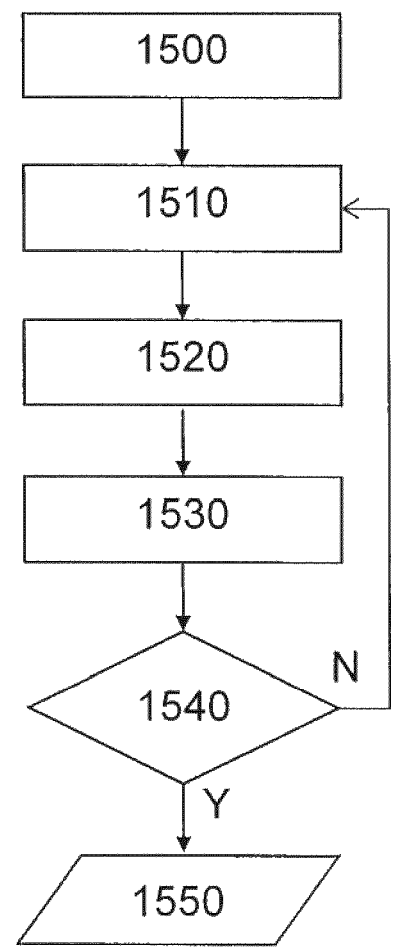
FIG. 16 shows a flow of an optimization according to an embodiment.

FIG. 16 shows a flow of an optimization according to an embodiment. The flow starts at 1500 with setting up the optimization. So, at 1500, the applicable model for simulation of a lithographic process is selected along with an applicable cost function for the optimization. In an embodiment, the model can include the sub-models described above in relation to FIG. 3. In an embodiment, the model and cost function are set-up for SMO. In an embodiment, the model and cost function are set-up for MO.

For example, an edge placement error (EPE)-based cost function may be expressed as:

$$CF(v_{src}, v_{mask}, v_{wave\ front}, v_{design}) = \sum_{pw, eval} w(pw, eval) \|EPE_{pw, eval}\|^p + p_{sidelobe} + p_{slope} + p_{mrc} + P_{src} + \ldots \quad (6)$$

wherein the cost function CF is in this case specified in terms one or more selected from: one or more variables of the illumination mode ($v_{src}$), one or more variables of creating the patterning device pattern ($v_{mask}$), one or more variables of the wavefront (e.g., the projection system) ($v_{wavefront}$) and/or one or more variables of the intended design pattern ($v_{design}$). For example, SMO might include at least one or more variables of the illumination mode ($v_{src}$), and one or more variables of creating the patterning device pattern ($v_{mask}$). Further, pw corresponds to the process window conditions simulated (e.g., focus and dose metric), eval corresponds to the evaluation points placed within the design pattern, w is a weighting factor for the particular process window condition pw and/or evaluation point eval, EPE is edge placement error being evaluated for the particular combination of process window condition pw and evaluation point eval, index p is a natural number for the approximation of the cost function CF, and one or more penalties selected from: $P_{sidelobe}$ which is a penalty corresponding to undesired side edge printing of the pattern, the slope of the edge of the simulated contour based on the applied evaluation points, $P_{slope}$ which is a penalty corresponding to the image slope (e.g., image log slope) of the pattern image, $P_{MRC}$ which is a penalty corresponding to one or more patterning device manufacturing rule checks, and $P_{src}$ which is a penalty corresponding to the design of the illumination mode. As will be appreciated, less (including none), more or different penalties can be applied.

Further, at 1500, various lithographic process information and initial conditions are obtained, such as a target design for which the patterning device pattern is being determined, an initial illumination mode (or if, for example, the process is MO, a desirably optimized illumination mode), a desired process window metric (e.g., focus and dose), etc.

In an embodiment, the flow uses a model (e.g., a projection optics submodel) that simulates the projection of radiation from a patterning device pattern, wherein the model models anamorphic demagnification imparted to radiation by the projection optics. In an embodiment, the model models reflective projection optics designed to project extreme ultraviolet radiation. In an embodiment, where the model models anamorphic demagnification, the process window metric is configured for the difference in demagnification, i.e., it accounts for a difference in, e.g., the X/horizontal direction and the Y/vertical direction in the patterning device pattern plane. That is, in an embodiment, the process window metric has a different patterning device bias for the X/horizontal direction and the Y/vertical direction in the patterning device pattern plane corresponding to the different demagnifications.

In an embodiment, where the optimization flow accounts for obscuration in the projection optics, the model (e.g., a projection optics submodel) simulates the projection of radiation from a patterning device pattern taking into account an obscuration in the projection optics. That is, the simulation model models projection of radiation by the projection optics including modeling an effect of obscuration in the projection optics.

In an embodiment, the model that accounts for an effect of obscuration in the projection optics further accounts for an anamorphic demagnification. In an embodiment, the model that accounts for an effect of obscuration in the projection optics is design to model a reflective projection system that is, for example, designed for EUV radiation. So, in an embodiment, the optimization is performed for an EUV anamorphic system that takes into account obscuration due to the EUV projection optics.

In an embodiment, the effective obscuration as "seen" by radiation from the patterning device pattern can vary though the exposure window. Accordingly, in an embodiment, the model accounts for variation of the obscuration across an exposure window produced by the lithographic projection apparatus. For example, as discussed above in relation to FIGS. 9 and 10, the illumination angle can vary across the exposure window. The different angles of illumination can, e.g., cause patterning device 3D effects or aberration that vary through the exposure window, which means that the diffracted radiation from the patterning device pattern across the exposure window effectively "sees" different shapes of obscuration of the projection optics. However, in an embodiment, the effect of the obscuration can be treated as being, and evaluated as such, at one particular location. For example, the obscuration can be treated as at a central portion of the pupil and at a central portion of the exposure window.

In an embodiment, an across-the-exposure-window Jones pupil can be used to describe the varied apodization arising from the obscuration in the projection optics. In embodiment, such a Jones pupil can be described as follows:

$$\begin{bmatrix} E_{x,out} \\ E_{y,out} \end{bmatrix} = \begin{bmatrix} J_{xx} & J_{xy} \\ J_{yx} & J_{yy} \end{bmatrix} \begin{bmatrix} E_{x,in} \\ E_{y,in} \end{bmatrix} \quad (7)$$

wherein $$\begin{bmatrix} E_{x,out} \\ E_{y,out} \end{bmatrix}$$

corresponds to the Jones output vector, $$\begin{bmatrix} J_{xx} & J_{xy} \\ J_{yx} & J_{yy} \end{bmatrix}$$

corresponds to the Jones matrix of the projection optics and $$\begin{bmatrix} E_{x,in} \\ E_{y,in} \end{bmatrix}$$

corresponds to the Jones input vector. So, to account for the scattering effect of an arbitrary shape of an obscuration (due to effectively a pupil stop obscuration in the projection optics), a Jones pupil has both real and imaginary parts. Apodization is the real part of $$\frac{J_{xx} + J_{yy}}{2},$$

and it accounts for the obscuration due to the effective pupil stop of, e.g., opening or spacing 1050. So, in an embodiment, there is provided a model that models the projection optics that has an across exposure window apodization corresponding to an obscuration of the projection optics.

Additionally or alternatively to an optimization flow that accounts for obscuration in the projection optics, the optimization flow can account for an effect of anamorphic demagnification. That is, in an embodiment where the model models projection of radiation by the projection optics including an anamorphic demagnification of radiation by the projection optics, the flow can configure, based on the model, a portion of the patterning device pattern taking into account an anamorphic manufacturing rule or anamorphic manufacturing rule ratio.

An anamorphic manufacturing rule comprises a rule that specifies a limit or permission in one direction in the plane of the patterning device pattern that is different than a limit or permission in another different direction in the plane of the patterning device pattern. An anamorphic manufacturing rule ratio is a modifier of a standard isomorphic manufacturing rule (i.e., a rule that sets permissions or limits to be the same in all directions in the patterning device pattern plane) to effectively convert that isomorphic manufacturing rule into an anamorphic manufacturing rule. In an embodiment, the different directions correspond to the directions in which there is different demagnification in an anamorphic demagnification. So, in an embodiment, the anamorphic manufacturing rule ratio can be one or more proportions to account for the different demagnification values. For example, if the isomorphic manufacturing rule is designed for a particular demagnification and the anamorphic demagnification is that same demagnification in a first direction and another demagnification in a second direction, then the anamorphic manufacturing rule ratio could simply be a ratio of the different demagnification values of the anamorphic demagnification (e.g., demagnification in the X/horizontal direction divided by the demagnification in the Y/vertical direction) such that the isomorphic manufacturing rule is applied to features in the first direction and the isomorphic manufacturing rule modified by the anamorphic manufacturing rule ratio is applied to features in the second direction. As will be appreciated, if the isomorphic manufacturing rule is for a demagnification value that is not shared in the anamorphic demagnification, then a plurality of proportions may be necessary to "scale" the isomorphic manufacturing rule to the different directions.

So, in an embodiment, one or more anamorphic manufacturing rules can be calculated (e.g., by scaling an isomorphic manufacturing rule), provided, or obtained in the setup at 1500. In an embodiment, an anamorphic manufacturing rule ratio can be calculated (e.g., calculated by creating a ratio between different demagnifications in an anamorphic demagnification), obtained or provided in the setup at 1500 for use with one or more isomorphic manufacturing rule provided or obtained in the setup at 1500.

Examples of patterning device manufacturing rules can include, for example, a limit or permission on a main feature width and/or spacing, a limit or permission on an assist feature width and/or space, a limit or permission on spacing between a main feature and an assist feature, etc. Typically, the patterning device manufacturing rules are related to limits or abilities of the processes and/or apparatuses used to create a patterning device pattern on a patterning device or limits or abilities of a patterning device (e.g., a SLM type patterning device) being able to form a patterning device pattern.

Having the anamorphic manufacturing rule or anamorphic manufacturing rule ratio that is based on demagnification difference of an anamorphic demagnification of projection optics, an optimization (e.g., a SMO or MO) for an anamorphic projection system can be performed to configure, e.g., a patterning device pattern and/or illumination mode, by taking into account a patterning device manufacturing rule (MRC) constraint that is independently set for different feature direction in the optimization. As noted, the feature orientation dependent MRC can be specified as absolute dimensions as an anamorphic manufacturing rule or as an anamorphic manufacturing rule ratio between, e.g., X/horizontal and Y/vertical orientations. For example, the anamorphic manufacturing rule ratio can be defined as X/horizontal demagnification divided by Y/vertical demagnification.

As will be discussed further below, in an embodiment, the anamorphic manufacturing rule or anamorphic manufacturing rule ratio can be used as a check during the optimization flow to identify, for example, violations of a manufacturing rule. For example, the anamorphic manufacturing rule or anamorphic manufacturing rule ratio can be used to identify features in a target design for which the patterning device pattern is being designed and/or identify features in a partially or fully optimized patterning device pattern, that violate a manufacturing rule and thus, e.g., cannot be manufactured on a patterning device, are capable of being rendered by a patterning device, etc. Such violations can be used to trigger redesign, typically of the target design for which the patterning device pattern is being created.

Figure 18A:
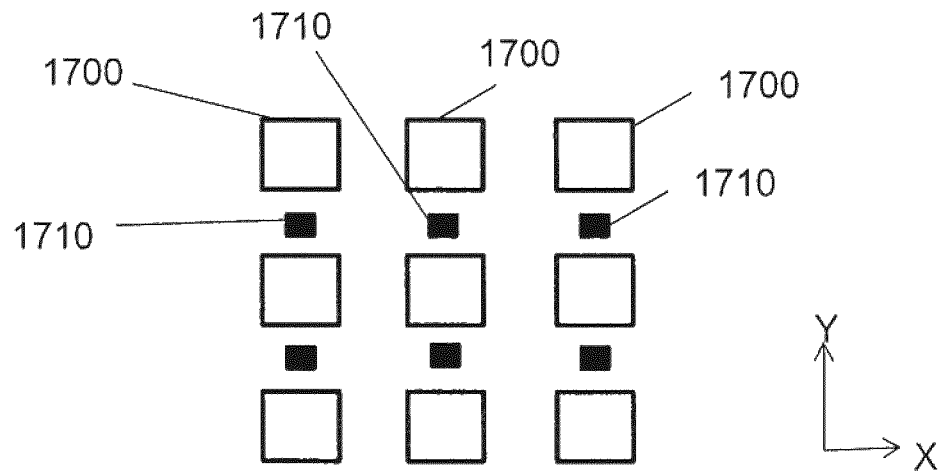
FIG. 18A shows a patterning device pattern configured using an isomorphic manufacturing rule.
Figure 18B:
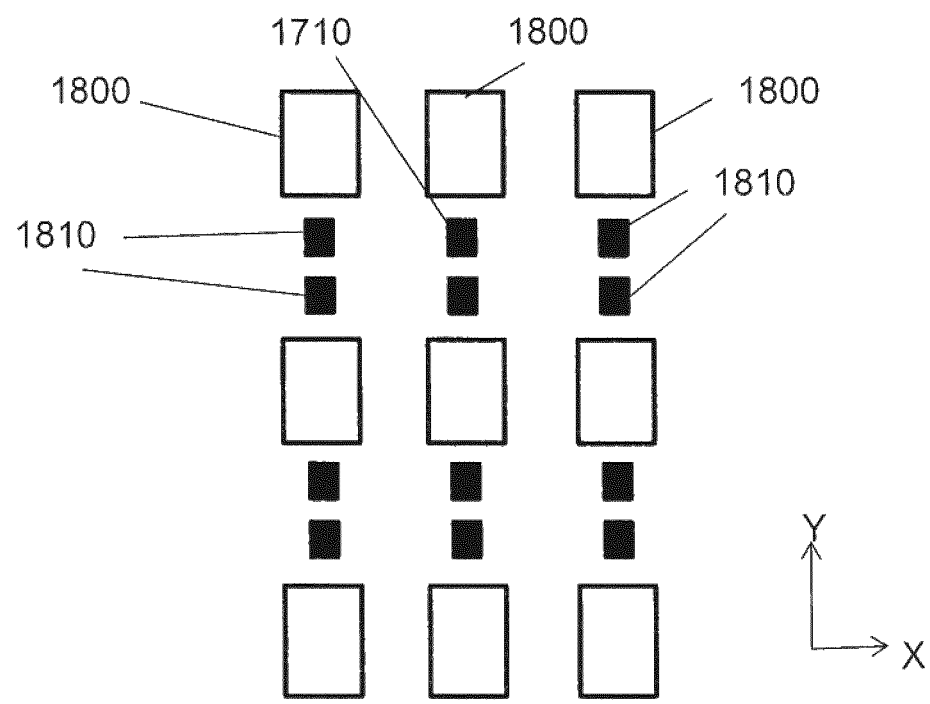
FIG. 18B shows a patterning device pattern configured using an anamorphic manufacturing rule or anamorphic manufacturing rule ratio.

Additionally or alternatively, the anamorphic manufacturing rule check or anamorphic manufacturing rule check ratio can be used as a penalty in the optimization cost function. Thus, the anamorphic manufacturing rule or anamorphic manufacturing rule ratio can be used to, e.g., maximize the scope of possible configurations permitted under the constraints or permissions of the anamorphic manufacturing rule or anamorphic manufacturing rule ratio. An example advantage of this use of the anamorphic manufacturing rule or anamorphic manufacturing rule ratio is shown in FIGS. 18A and 18B. FIG. 18A shows a patterning device pattern configured using an isomorphic manufacturing rule, such as an isomorphic manufacturing rule designed for 4 times demagnification. In this example, features 1700 correspond to main feature (e.g., contact holes or vias) and features 1710 correspond to assist features (e.g., sub-resolution assist features). When this patterning device pattern is projected on the substrate using an isomorphic demagnification of 4, each of the features 1700 and 1710 would meet the applicable one or more isomorphic manufacturing rules, e.g., in terms of feature 1710 size or in terms of spacing between a feature 1700 and an adjacent feature 1710 when analyzed at the substrate level or at the patterning device pattern level.

Now, FIG. 18B shows a patterning device pattern configured using an anamorphic manufacturing rule or anamorphic manufacturing rule ratio as, e.g., a penalty to the cost function of an optimization. Here, an anamorphic demagnification is used that is, for example, 8 times in the Y direction and 4 times in X direction. So, to make the same size features at the substrate level as in the case of the patterning device pattern of FIG. 18A, the size of main features 1800 would be elongated in the Y direction as well the spacing between features 1800 would be elongated in the Y direction. But, this presents an opportunity for the use of assist features 1810, which do not necessarily have to have their sizes scaled in the same fashion as the main features or the spacing between main features or have their spacing with main features (or between themselves) be scaled in the same fashion as the main features or the spacing between main features. Thus, as seen in FIG. 18B, additional assist features 1810 can be placed between main features 1800 at appropriate spacing, which together still meet a manufacturing rule for the patterning device pattern. Thus, all the assist features 1810 and their spacing still meet size and/or spacing rules for manufacture of those assist features 1810. This can be readily seen when compared to FIG. 18A; the dimensions of assist features 1810 could the same size or larger than assist features 1710 and their spacing from an adjacent main feature 1800 could the same size or larger than the spacing between a main feature 1700 and an adjacent assist feature 1710. So, additional or augmented OPC (in this example, in the form of assist features) can be implemented through the use of an anamorphic manufacturing rule or anamorphic manufacturing rule ratio compared to merely relying on a traditional isomorphic manufacturing rule for optimizing a patterning device pattern subject to anamorphic demagnification.

Returning then to FIG. 16, with the optimization setup at 1500, a forward simulation is performed at 1510 using the model from setup at 1500 to determine how a patterning device pattern in the optimization process produces a simulated pattern at the substrate level. In an embodiment, that model can be designed to take account an effect of an obscuration in projection optics. In an embodiment, that model can be designed to account for an anamorphic demagnification of the projection optics at least when an anamorphic manufacturing rule or anamorphic manufacturing rule ratio is used in the optimization flow. In an embodiment, the model further accounts for a topography of a patterning device for which the patterning device pattern is configured as part of the forward simulation. Details of using patterning device 3D effects (i.e., topography) are discussed above and can be incorporated in this simulation. In an embodiment, the model further accounts for a defocus of a patterning device for which the patterning device pattern is configured. Details of using patterning device defocus are discussed above and can be incorporated in this simulation. In an embodiment, the model can be used to treat the patterning device pattern such that transmission at all locations of the portion of the patterning device pattern is not restricted to a number of discrete values.

At 1520, one or more of the design variables of the lithographic process are configured in conjunction with evaluation of a cost function as described below in conjunction with the simulation results from 1510. For example, the one or more design variables can include one or more parameters, such as geometric parameters, of the patterning device pattern. In particular, the one or more parameters of the patterning device enable configuration of the layout of the patterning device pattern in terms of, e.g., applying various OPC such as changing one or more dimensions of patterning device feature (e.g., applying a bias to all or part of a feature) and/or applying an assist feature (e.g., a SBAR, SRIF or SRAF), etc. In an embodiment, if the target design for creating the patterning device pattern is larger than the applicable exposure field (e.g., the half field 1400 or 1410 as described in relation to FIGS. 11A and 11B), then configuration (e.g., the OPC) should handle any necessary stitching of part of the target design exposed in one exposure field with another part of the target design exposed in another exposure field.

In an embodiment, the patterning device pattern configuration (e.g., OPC) at 1520 is handled at the patterning device level using an anamorphic manufacturing rule or anamorphic manufacturing rule ratio. So, for example, the patterning device pattern features can be evaluated at the patterning device level according to manufacturing rules to, for example, identify MRC violations, which can be documented with violation data (e.g., marked) at patterning device coordinates. So, in an embodiment, the optimization of the patterning device pattern can be checked and configured for OPC at the patterning device level using the applicable anamorphic magnification in the simulation and the anamorphic manufacturing rule or anamorphic manufacturing rule ratio.

Where the one or more design variables include one or more parameters of the illumination mode (i.e., the illumination mode is being configured), there can also or alternatively be, at 1520, a change to a parameter of the illumination mode (e.g., a change in an illumination mode shape). In an embodiment, the parameter of the illumination mode comprises an optical dose of the lithographic process. In an embodiment, the illumination shape of the illumination mode is configured under a condition that the illumination mode shape can have a freeform shape and/or a parametric shape. Where the illumination mode has a freeform shape then once the freeform shape is configured following a cost function of the optimization flow reaching a termination condition, the configured freeform shape of the illumination mode can be mapped to a discrete illumination shape (e.g., to a set of discrete mirrors, each mirror having a set of states).

At 1530, the cost function defined for the optimization flow can be evaluated using the simulation results to enable the adjustment of the one or more design variables (such as one or more parameters of the patterning device pattern) of the optimization. In an embodiment, the cost function can be the same or similar to the form of equation (6). In an embodiment, the cost function can have an anamorphic manufacturing rule or anamorphic manufacturing rule ratio as a penalty. As will be appreciated the cost function can have a different form and can be based on a different process performance parameter than EPE or based on a combination of process performance parameters (which may include EPE or not). In an embodiment, the cost function is evaluated at substrate level, i.e., in terms of performance of producing the desired substrate pattern corresponding the target design for producing the patterning device pattern as part of the optimization flow.

At 1540, a termination condition (such as any of the termination conditions discussed herein) of the cost function is evaluated. If the termination condition has not been reached, then 1510, 1520, 1530 are repeated along with reevaluation at 1540. If a termination condition has been reached, then the configuration of the one or more design variables is finished and, for example, at least the patterning device pattern has been fully configured to the extent possible subject to any violations identified by a MRC.

At 1550, information regarding the optimization flow is output. For example, the patterning device pattern (e.g., in terms of polygons) at patterning device level can be output. In an embodiment, one or more MRC violations, if any, can be output along with the locations in patterning device pattern coordinates of those one or more MRC violations. In an embodiment, the expected process window (e.g., a focus and dose process window) can be output for the patterning device pattern (e.g., as a whole or for various points with the patterning device pattern). In an embodiment, one or more MEEF values can be output. In an embodiment, the manufacturing rule analysis and techniques described herein using an anamorphic manufacturing rule or anamorphic manufacturing rule ratio can be applied to any other printing defects (e.g., defects on the substrate level contour) such as CD errors, substrate level necking, substrate level bridging of substrate pattern features, etc.

Figure 17:
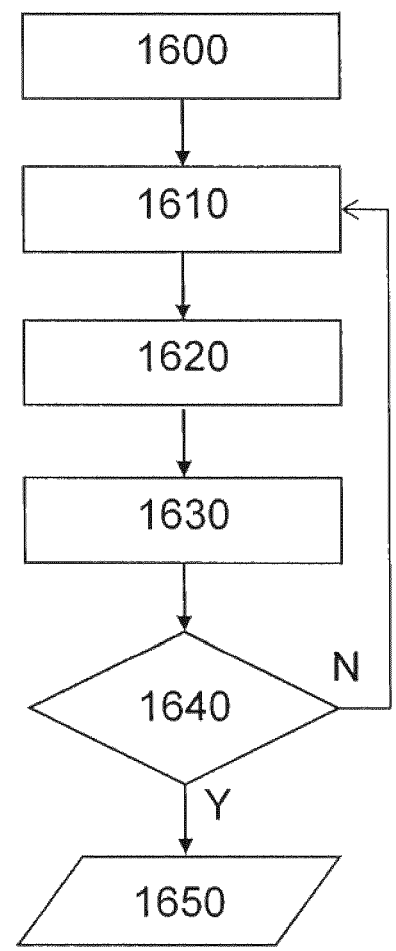
FIG. 17 shows a flow of an optimization according to an embodiment.

Referring to FIG. 17, a further optimization flow is schematically depicted and is similar to the flow of FIG. 16 except as provided below. For example, 1600 involves setup of the optimization flow, such as setup of the model, initial conditions, etc. like 1500 in FIG. 16. Further, 1610 involves a forward simulation like 1510 of FIG. 16. Now, at 1620, one or more of the design variables of the lithographic process are configured in conjunction with evaluation of a cost function as described below in relation to 1630 in conjunction with the simulation results from 1610. For example, the one or more design variables can include one or more parameters, such as geometric parameters, of the patterning device pattern. In particular, the one or more parameters of the patterning device enable configuration of the layout of the patterning device pattern in terms of, e.g., applying various OPC such as changing one or more dimensions of patterning device feature (e.g., applying a bias to all or part of a feature) and/or applying an assist feature (e.g., a SBAR, SRIF or SRAF), etc. But, rather than the patterning device pattern configuration (e.g., OPC) being handled at the patterning device level using an anamorphic manufacturing rule or anamorphic manufacturing rule ratio, the evaluation of whether to apply a particular OPC in the patterning device pattern is performed at a 1× substrate level. In an embodiment, the evaluation at 1× substrate level is evaluation of the patterning device pattern as produced at the substrate in terms of OPC checking and application, where the OPC is then scaled up to the patterning device pattern in accordance with the applicable anamorphic magnification. So, for example, the patterning device pattern features as patterned on the substrate can be evaluated at the substrate level according to manufacturing rules to, for example, identify MRC violations, which can be documented with violation data (e.g., marked) at substrate level coordinates, which substrate level coordinates can then be converted to patterning device coordinates such that MRC violation data can be associated with specific locations at the patterning device level in patterning device coordinates. So, in an embodiment, the optimization of the patterning device pattern is evaluated at the substrate level of the 1× target design layout as produced at the substrate level and checked using the anamorphic manufacturing rule or anamorphic manufacturing rule ratio and the determined OPC corrections are then scaled up the patterning device pattern based on the anamorphic magnification values.

Then, at 1630, a cost function can be evaluated based on the simulated results and in conjunction with configuration of one or more design variables of the lithographic process similar to 1530 of FIG. 16. At 1640, like 1540 in FIG. 16, a termination condition for the cost function is evaluated. If the termination condition is not reached, then 1610, 1620 and 1630 are repeated and the evaluation of 1640 is performed again until the termination condition is reached. When the termination condition is reached, data regarding the optimization flow is output at 1650, much like at 1550 in FIG. 16. Optionally, the reported information can include MRC violation information specified for substrate coordinates.

Figure 19:
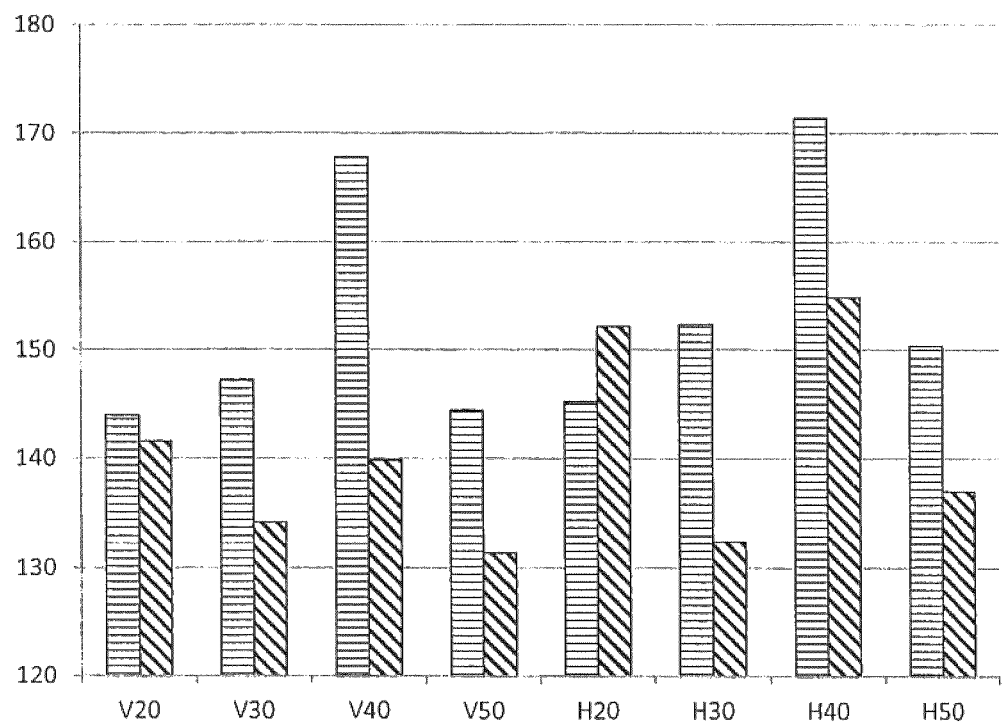
FIG. 19 is a graph of example data regarding image log slope for various features with specific orientations at particular pitches where one set of data is for features configured accounting for projection optics obscuration and another set of data is for features not so configured.

FIG. 19 presents some data showing how inclusion of an effect of the obscuration of the projection optics in the configuration of the patterning device pattern can have some significant effect in improving the substrate pattern produced from a patterning device pattern so configured. In the graph of FIG. 19, the vertical axis is image log slope (ILS), which is a measure of contrast. The horizontal axis is a set of various features of a certain orientation type and each at a certain pitch. In particular, there are features with a vertical (V) orientation at pitches of 20, 30, 40 and 50 nm and features with a horizontal (H) orientation at pitches of 20, 30, 40 and 50 nm. The CD of the features is 10 nm. The bars with the diagonal pattern corresponds to data simulated with a projection optics having an obscuration but the patterning device pattern wasn't configured using a simulation model that accounts for the effect of the obscuration. As seen in FIG. 19, the ILS for, e.g., V30, V50, H30 and H50 are quite low, but even the ILS for V40 and H40 is impacted. The bars with the horizontal pattern corresponds to data simulated with a projection optics having an obscuration but the patterning device pattern was configured using a simulation model that accounts for the effect of the obscuration (in this case, using just a central obscuration with accounting for variation of the obscuration across the exposure window). As seen in FIG. 19, the ILS has significantly increased almost all the various features except for H20 and V20 which had little impact to their ILS due to obscuration in the first place. So, as shown by this data, the contrast can be significantly improved for a number of challenging pitches by using a model that accounts for the effect of an obscuration in the projection optics in the configuration of the patterning device pattern.

In an embodiment, the techniques herein can apply to a regular patch based full chip optical proximity correction (OPC) flow. In such a flow, a full chip patterning device pattern is segmented into patches and the techniques described herein are applied to the respective patches, which respective patches can assembled together to yield a full chip patterning device pattern.

In an embodiment, the techniques herein can enable correct identification of critical feature locations (e.g., an anamorphic manufacturing rule or anamorphic manufacturing rule ratio) and to convert a gauge to a correct orientation to quantify the patterning device feature error and characterize the MEEF.

In an embodiment, techniques herein provide an extreme ultraviolet lithography high numerical aperture anamorphic optimization method.

Figure 20:
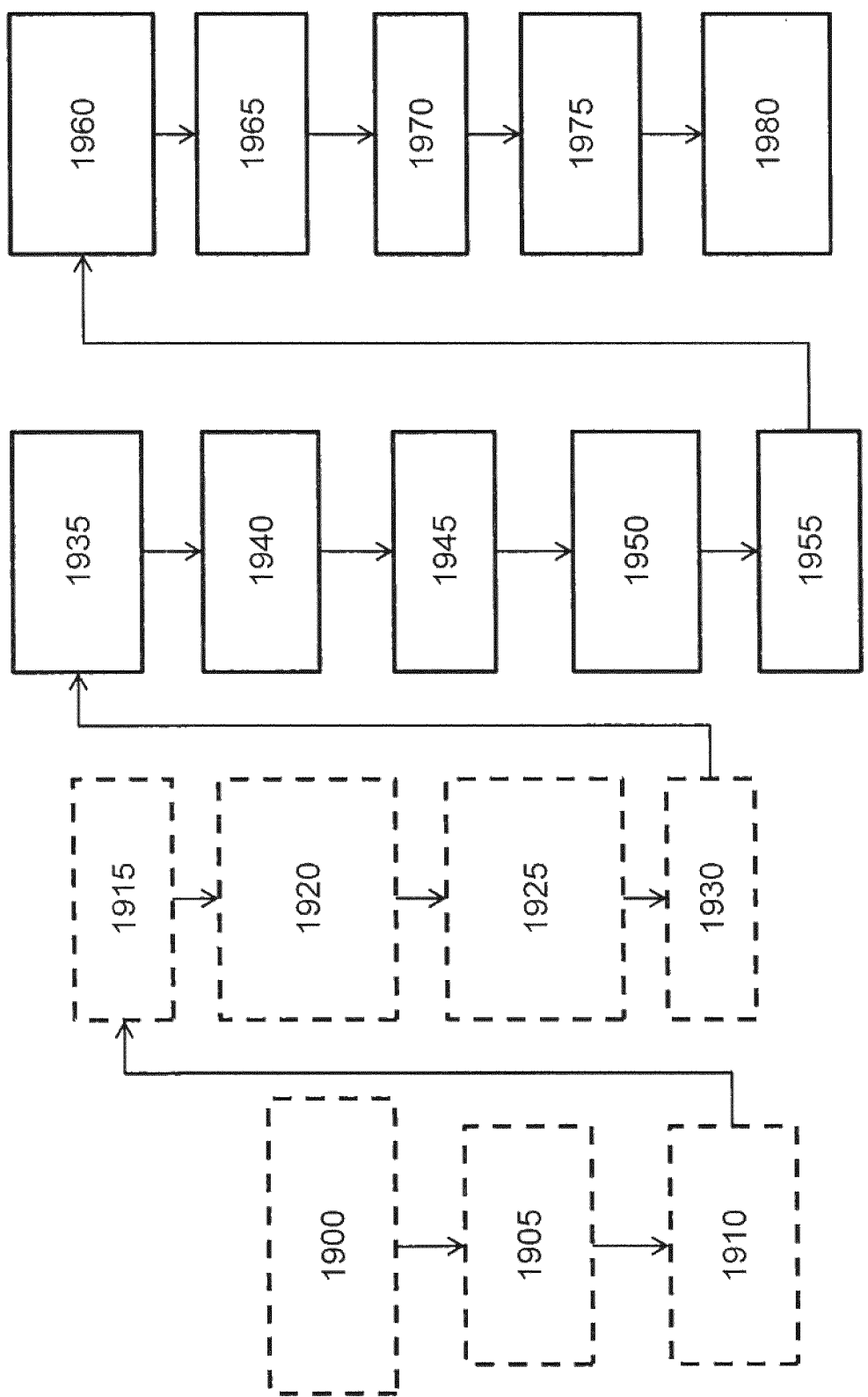
FIG. 20 shows a flow of an optimization according to an embodiment.

FIG. 20 shows an embodiment of SMO flow. A first part, which can be optional, relates to application of one or more SRAFs into the patterning device pattern, while a second part relates to an optimization flow that can be used where the patterning device pattern is not supplemented with one or more SRAFs or where the patterning device pattern has been previously supplemented with one or more SRAFs using the first part.

Referring to FIG. 20, a first optional part is shown by dashed lines. In this first part, at 1900, a freeform illumination shape and a CTM version of the patterning device pattern are co-optimized. Then, at 1905, SRAFs are placed into the patterning device pattern, including conversion of the CTM version of the patterning device pattern into polygons. At 1910, extracted SRAFs are adjusted and patterning device pattern simplifications are made. At 1915, a patterning device pattern-only optimization is performed using the patterning device pattern having the one or more SRAFs. At 1920, a MRC-free freeform illumination mode shape and freeform polygon patterning device pattern optimization (optimization with anamorphic manufacturing rule or anamorphic manufacturing rule ratio) is performed. At 1925, SBARs are cleaned up based on an anamorphic manufacturing rule or anamorphic manufacturing rule ratio and fit into rectangles as part of an optimization. Then at 1930, a focus and dose optimization is performed using the SBAR cleaned up patterning device pattern.

At 1935, a freeform illumination mode shape and patterning device pattern optimization is performed with an anamorphic manufacturing rule or anamorphic manufacturing rule ratio. The patterning device pattern could be an initial patterning device pattern based on a target design or an optimized patterning device pattern after SRAF extraction (e.g., from 1930). At 1940, patterning device defocus tuning is performed on at least the patterning device pattern. At 1945, a dose and focus optimization is performed on the patterning device pattern. At 1950, a high NA (e.g., greater than about 0.33) illumination mode shape rendering is performed. Then at 1955, a dose and focus optimization is performed using the patterning device pattern and the rendered illumination mode shape. At 1960, a discrete illumination mode shape is created for a set of discrete mirrors to produce the illumination mode shape and a patterning device pattern optimization is performed using with an anamorphic manufacturing rule or anamorphic manufacturing rule ratio. At 1965, a Hopkins model is generated and at 1970, a dose optimization is performed. Then at 1975, a patterning device pattern-only optimization is performed with an anamorphic manufacturing rule or anamorphic manufacturing rule ratio. Then at 1980, information regarding the optimized patterning device pattern and illumination mode are output and a final model can be generated. As will be appreciated by those skilled in the art, one or more of the steps may be omitted, changed in order, substituted with a different step, etc.

In an embodiment, there is provided a method to improve a lithographic process for imaging a portion of a patterning device pattern onto a substrate using a lithographic projection apparatus comprising an illumination system and projection optics, the method comprising: obtaining a simulation model that models projection of radiation by the projection optics, wherein the simulation model models an effect of an obscuration in the projection optics; and configuring, based on the model and by a hardware computer, the portion of the patterning device pattern.

In an embodiment, the simulation model accounts for variation of the obscuration across an exposure window produced by the lithographic projection apparatus. In an embodiment, the configuring further takes into account an anamorphic manufacturing rule or anamorphic manufacturing rule ratio. In an embodiment, the model models anamorphic demagnification imparted to radiation by the projection optics. In an embodiment, the model further accounts for a topography of a patterning device for which the patterning device pattern is configured. In an embodiment, the model further accounts for a defocus of a patterning device for which the patterning device pattern is configured. In an embodiment, the method further comprises configuring the patterning device pattern wherein transmission at all locations of the portion of the patterning device pattern is not restricted to a number of discrete values. In an embodiment, the method further comprises configuring, based on the model, a parameter of an illumination mode used to illuminate the patterning device pattern. In an embodiment, the parameter of the illumination mode comprises an optical dose of the lithographic process. In an embodiment, the method further comprises configuring an illumination shape of the illumination mode under a condition that the illumination mode shape can have a freeform shape and/or a parametric shape. In an embodiment, the illumination mode shape has a freeform shape and further comprising mapping the configured freeform shape of the illumination mode to a discrete illumination shape. In an embodiment, the model models reflective projection optics designed to project extreme ultraviolet radiation. In an embodiment, a numerical aperture of the projection optics is greater than about 0.33. In an embodiment, the configuring the portion of the patterning device pattern comprises placing one or more assist features into the portion. In an embodiment, the assist features comprise a sub resolution assist feature, a printable resolution assist feature, or a combination thereof. In an embodiment, the model is configured to calculate an aerial image by using an Abbe or Hopkins' formula.

In an embodiment, there is provided a method to improve a lithographic process for imaging a portion of a patterning device pattern onto a substrate using a lithographic projection apparatus comprising an illumination system and projection optics, the method comprising: obtaining a simulation model that models projection of radiation by the projection optics, wherein the simulation model models an anamorphic demagnification of radiation by the projection optics; and configuring, based on the model and by a hardware computer, the portion of the patterning device pattern taking into account an anamorphic manufacturing rule or anamorphic manufacturing rule ratio.

In an embodiment, the configuring takes into account an anamorphic manufacturing rule having differing geometric limits or permissions for different directions in a plane of the patterning device pattern. In an embodiment, the configuring takes into account an anamorphic manufacturing rule ratio that is used in combination with an isomorphic manufacturing rule specifying the same geometric limits or permissions for all directions in a plane of the patterning device pattern. In an embodiment, the anamorphic manufacturing rule or anamorphic manufacturing rule ratio is used to evaluate the patterning device pattern at the patterning device or used to evaluate the patterning device pattern as produced at a 1× substrate level. In an embodiment, the model further accounts for a topography of a patterning device for which the patterning device pattern is configured. In an embodiment, the model further accounts for a defocus of a patterning device for which the patterning device pattern is configured. In an embodiment, the method further comprises configuring the patterning device pattern wherein transmission at all locations of the portion of the patterning device pattern is not restricted to a number of discrete values. In an embodiment, the method further comprises configuring, based on the model, a parameter of an illumination mode used to illuminate the patterning device pattern. In an embodiment, the parameter of the illumination mode comprises an optical dose of the lithographic process. In an embodiment, the method further comprises configuring an illumination shape of the illumination mode under a condition that the illumination mode shape can have a freeform shape and/or a parametric shape. In an embodiment, the illumination mode has a freeform shape and further comprising mapping the configured freeform shape of the illumination mode to a discrete illumination shape. In an embodiment, the model models reflective projection optics designed to project extreme ultraviolet radiation. In an embodiment, a numerical aperture of the projection optics is greater than about 0.33. In an embodiment, the configuring the portion of the patterning device pattern comprises placing one or more assist features into the portion. In an embodiment, the assist features comprise a sub resolution assist feature, a printable resolution assist feature, or a combination thereof. In an embodiment, the model is configured to calculate an aerial image by using an Abbe or Hopkins' formula.

Figure 21:
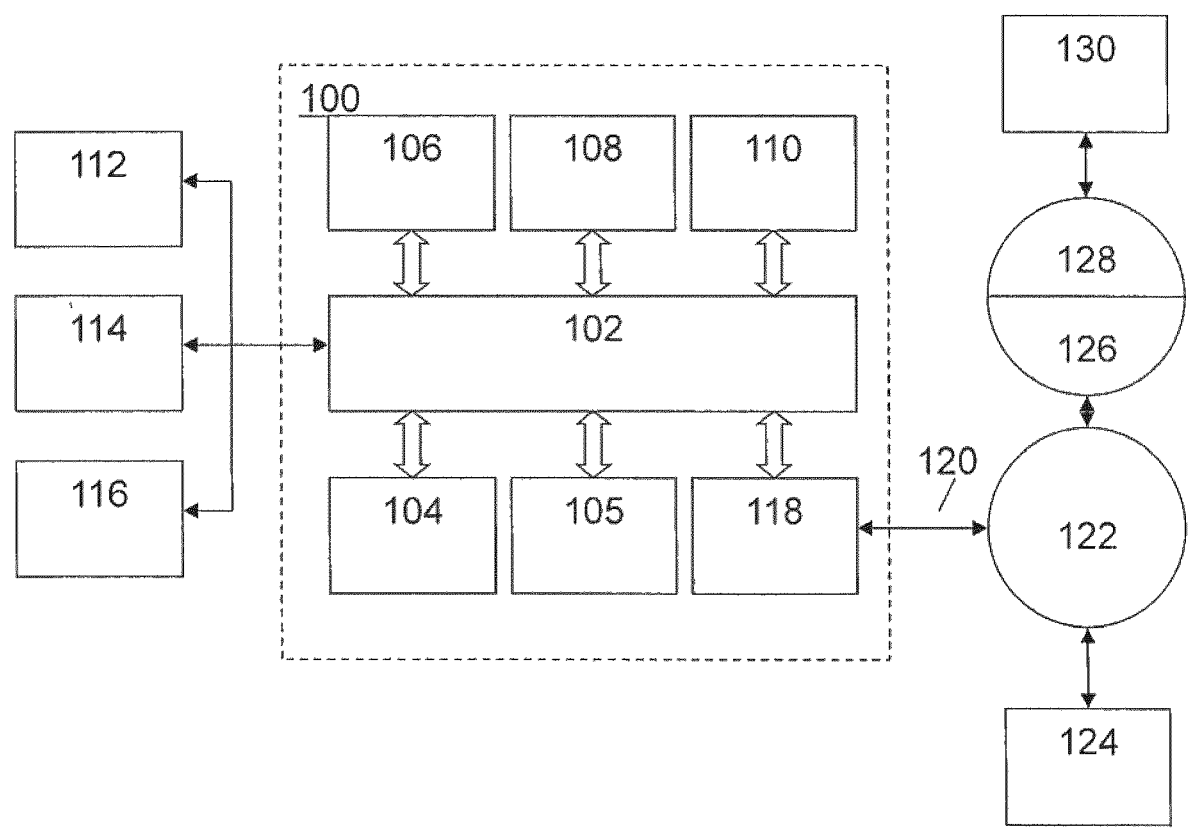
FIG. 21 is a block diagram of an example computer system in which embodiments can be implemented.

FIG. 21 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106.

Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 22:
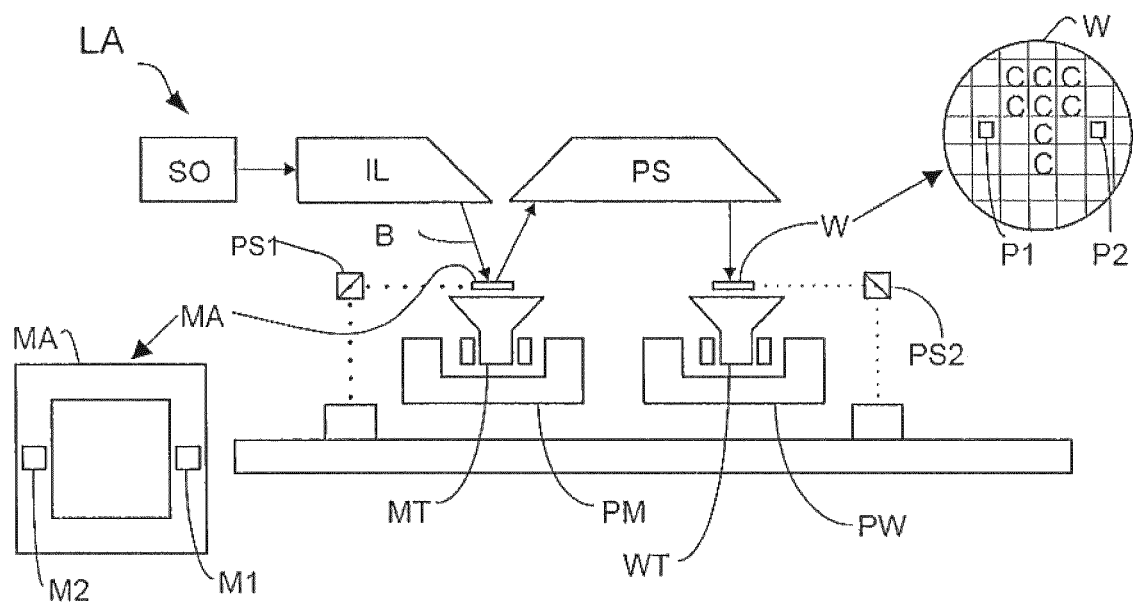
FIG. 22 is a schematic diagram of another lithographic projection apparatus.

FIG. 22 schematically depicts another exemplary lithographic projection apparatus LA that includes:
 a source collector module SO to provide radiation.
 an illumination system (illuminator) IL configured to condition a radiation beam B (e.g. EUV radiation) from the source collector module SO.
 a support structure (e.g. a mask table) MT constructed to support a patterning device (e.g. a mask or a reticle) MA and connected to a first positioner PM configured to accurately position the patterning device;
 a substrate table (e.g. a wafer table) WT constructed to hold a substrate (e.g. a resist coated wafer) W and connected to a second positioner PW configured to accurately position the substrate; and
 a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multilayer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 22, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 22, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 23:
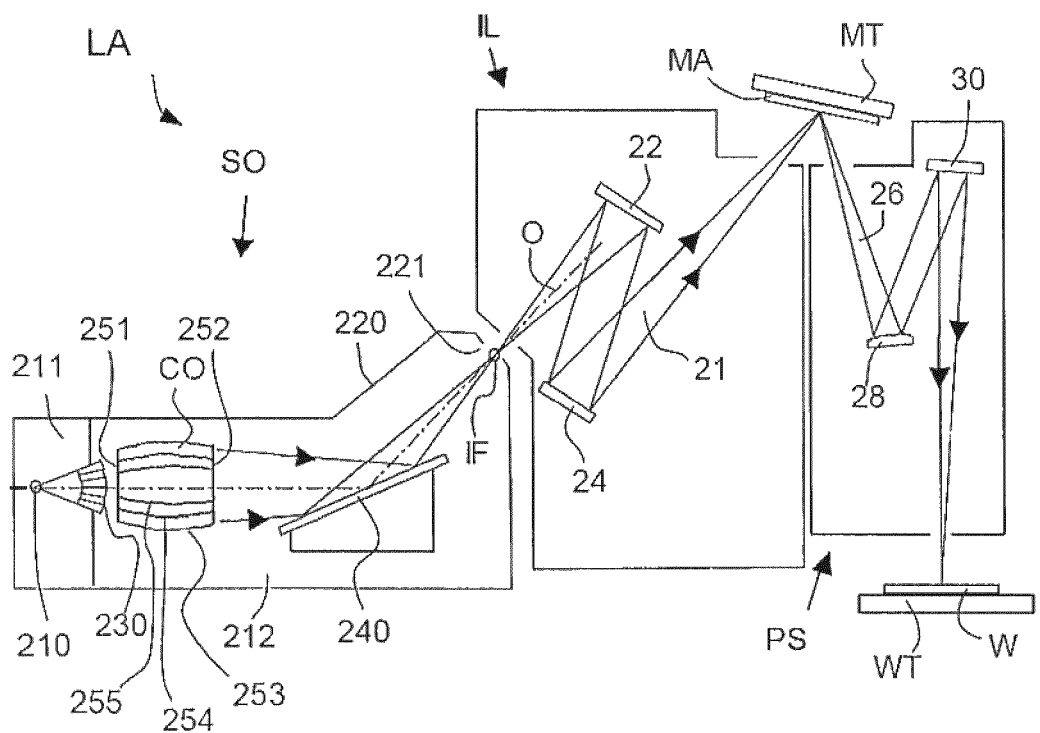
FIG. 23 is a more detailed view of the apparatus in FIG. 22.

FIG. 23 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 23.

Collector optic CO, as illustrated in FIG. 23, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 24:
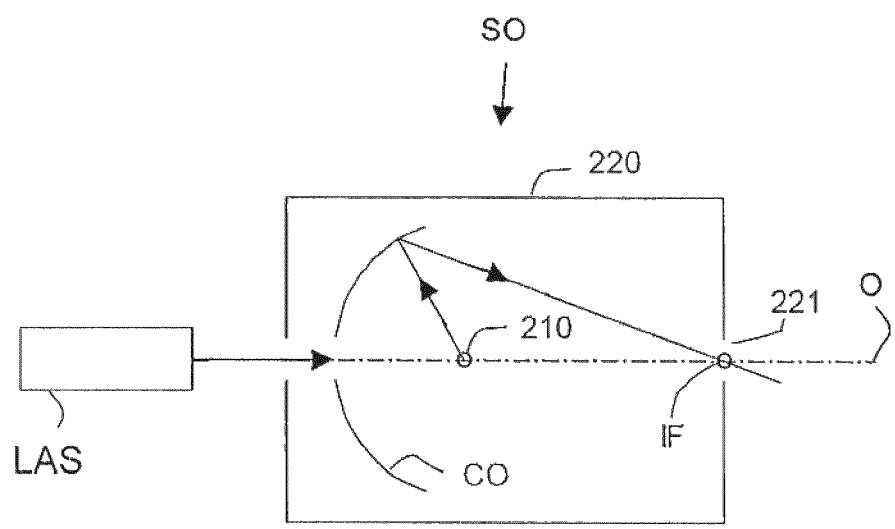
FIG. 24 is a more detailed view of the source collector module of the apparatus of FIG. 22 and FIG. 23.

Alternatively, the source collector module SO may be part of an LPP radiation system as shown in FIG. 24. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method to improve a lithographic process for imaging a portion of a patterning device pattern onto a substrate using a lithographic apparatus comprising an illumination system and projection optics, the method comprising:
   obtaining a simulation model that models projection of radiation by the projection optics, wherein the simulation model models an effect of an obscuration in the projection optics; and
   configuring, based on the model and by a hardware computer, the portion of the patterning device pattern.
2. The method of clause 1, wherein the simulation model accounts for variation of the obscuration across an exposure window produced by the lithographic apparatus.
3. The method of clause 1 or clause 2, wherein the configuring further takes into account an anamorphic manufacturing rule or anamorphic manufacturing rule ratio.
4. The method of any of clauses 1-3, wherein the model models anamorphic demagnification imparted to radiation by the projection optics.
5. The method of any of clauses 1-4, wherein the model further accounts for a topography of a patterning device for which the patterning device pattern is configured.
6. The method of any of clauses 1-5, wherein the model further accounts for a defocus of a patterning device for which the patterning device pattern is configured.
7. The method of any of clauses 1-6, further comprising configuring the patterning device pattern wherein transmission at all locations of the portion of the patterning device pattern is not restricted to a number of discrete values.
8. The method of any of clauses 1-7, further comprising configuring, based on the model, a parameter of an illumination mode used to illuminate the patterning device pattern.
9. The method of clause 8, wherein the parameter of the illumination mode comprises an optical dose of the lithographic process.
10. The method of clause 8 or clause 9, further comprising configuring an illumination shape of the illumination mode under a condition that the illumination mode shape can have a freeform shape and/or a parametric shape.
11. The method of clause 10, wherein the illumination mode shape has a freeform shape and further comprising mapping the configured freeform shape of the illumination mode to a discrete illumination shape.
12. The method of any of clauses 1-11, wherein the model models reflective projection optics designed to project extreme ultraviolet radiation.
13. The method of any of clauses 1-12, wherein a numerical aperture of the projection optics is greater than about 0.33.
14. The method of any of clauses 1-13, wherein the configuring the portion of the patterning device pattern comprises placing one or more assist features into the portion.
15. The method of clause 14, wherein the assist features comprise a sub resolution assist feature, a printable resolution assist feature, or a combination thereof.
16. The method of any of clauses 1-15, wherein the model is configured to calculate an aerial image by using an Abbe or Hopkins' formula.
17. A method to improve a lithographic process for imaging a portion of a patterning device pattern onto a substrate using a lithographic projection comprising an illumination system and projection optics, the method comprising:
    obtaining a simulation model that models projection of radiation by the projection optics, wherein the simulation model models an anamorphic demagnification of radiation by the projection optics; and
    configuring, based on the model and by a hardware computer, the portion of the patterning device pattern taking into account an anamorphic manufacturing rule or anamorphic manufacturing rule ratio.
18. The method of clause 17, wherein the configuring takes into account an anamorphic manufacturing rule having differing geometric limits or permissions for different directions in a plane of the patterning device pattern.
19. The method of clause 17 or clause 18, wherein the configuring takes into account an anamorphic manufacturing rule ratio that is used in combination with an isomorphic manufacturing rule specifying the same geometric limits or permissions for all directions in a plane of the patterning device pattern.
20. The method of any of clauses 17-19, wherein the anamorphic manufacturing rule or anamorphic manufacturing rule ratio is used to evaluate the patterning device pattern at the patterning device or used to evaluate the patterning device pattern as produced at a 1× substrate level.
21. The method of any of clauses 17-20, wherein the model further accounts for a topography of a patterning device for which the patterning device pattern is configured.
22. The method of any of clauses 17-21, wherein the model further accounts for a defocus of a patterning device for which the patterning device pattern is configured.
23. The method of any of clauses 17-22, further comprising configuring the patterning device pattern wherein transmission at all locations of the portion of the patterning device pattern is not restricted to a number of discrete values.
24. The method of any of clauses 17-23, further comprising configuring, based on the model, a parameter of an illumination mode used to illuminate the patterning device pattern.
25. The method of clause 24, wherein the parameter of the illumination mode comprises an optical dose of the lithographic process.
26. The method of clause 24 or clause 25, further comprising configuring an illumination shape of the illumination mode under a condition that the illumination mode shape can have a freeform shape and/or a parametric shape.
27. The method of clause 26, wherein the illumination mode has a freeform shape and further comprising mapping the configured freeform shape of the illumination mode to a discrete illumination shape.

28. The method of any of clauses 17-27, wherein the model models reflective projection optics designed to project extreme ultraviolet radiation.

29. The method of any of clauses 17-28, wherein a numerical aperture of the projection optics is greater than about 0.33.

30. The method of any of clauses 17-29, wherein the configuring the portion of the patterning device pattern comprises placing one or more assist features into the portion.

31. The method of clause 30, wherein the assist features comprise a sub resolution assist feature, a printable resolution assist feature, or a combination thereof.

32. The method of any of clauses 17-31, wherein the model is configured to calculate an aerial image by using an Abbe or Hopkins' formula.

33. A method to improve a lithographic process for imaging a portion of a patterning device pattern onto a substrate using a lithographic projection comprising an illumination system and projection optics, the method comprising:
obtaining a through exposure window obscuration shape of the projection optics;
determining an adjusted portion of the patterning device pattern for each of a plurality of exposure window positions of the projection optics at least partially based on any geometry shape of obscuration.

34. The method of clause 33, further comprising determining an illumination mode shape for each of a plurality of exposure window positions of the projection optics at least partially based on any geometry shape of obscuration.

35. The method of clause 33 or clause 34, wherein determining the adjusted portion of the patterning device pattern comprises making a change to a main feature and/or an addition or change of an assist feature of the patterning device pattern.

36. A method to improve a lithographic process for imaging a portion of a patterning device pattern onto a substrate using a lithographic projection comprising an illumination system and projection optics, the method comprising:
obtaining a through exposure window obscuration shape of the projection optics;
determining an illumination mode shape for the portion of a given patterning device pattern for each of a plurality of exposure window positions of the projection optics at least partially based on any geometry shape of obscuration.

37. A computer program product comprising a non-transitory computer readable medium having instructions recorded thereon, the instructions when executed by a computer implementing the method of any of clauses 1-36.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of 365, 248, 193, 157 or 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method to improve a lithographic process for imaging a portion of a patterning device pattern onto a substrate using a lithographic apparatus comprising an illumination system and projection optics, the method comprising:
    obtaining a simulation model that models projection of radiation by the projection optics, wherein the simulation model models an effect of an obscuration in the projection optics and the simulation model accounts for variation of the obscuration across an exposure window produced by the lithographic apparatus; and
    configuring, based on the model and by a hardware computer, the portion of the patterning device pattern.

2. The method of claim 1, wherein the configuring further takes into account an anamorphic manufacturing rule or anamorphic manufacturing rule ratio.

3. The method of claim 1, wherein the model models anamorphic demagnification imparted to radiation by the projection optics.

4. The method of claim 1, wherein the model further accounts for a topography of a patterning device for which the patterning device pattern is configured.

5. The method of claim 1, wherein the model further accounts for a defocus of a patterning device for which the patterning device pattern is configured.

6. The method of claim 1, further comprising configuring the patterning device pattern, wherein transmission at all locations of the portion of the patterning device pattern is not restricted to a number of discrete values.

7. The method of claim 1, further comprising configuring, based on the model, a parameter of an illumination mode used to illuminate the patterning device pattern.

8. The method of claim 7, wherein the parameter of the illumination mode comprises an optical dose of the lithographic process.

9. The method of claim 8, further comprising configuring an illumination shape of the illumination mode under a condition that the illumination mode shape can have a freeform shape and/or a parametric shape.

10. The method of claim 1, wherein the model models reflective projection optics designed to project extreme ultraviolet radiation.

11. The method of claim 1, wherein a numerical aperture of the projection optics is greater than about 0.33.

12. The method of claim 1, wherein the configuring the portion of the patterning device pattern comprises placing one or more assist features into the portion.

13. The method of claim 12, wherein the assist features comprise a sub resolution assist feature, a printable resolution assist feature, or a combination thereof.

14. The method of claim 1, wherein the model is configured to calculate an aerial image by using an Abbe or Hopkins' formula.

15. A computer program product comprising a non-transitory computer readable medium having instructions therein, the instructions, upon execution by a computer system, configured to cause the computer system to at least:
    obtaining a simulation model that models projection of radiation by projection optics of a lithographic apparatus for imaging a portion of a patterning device pattern onto a substrate, wherein the simulation model models an effect of an obscuration in the projection optics and the simulation model accounts for variation of the obscuration across an exposure window produced by the lithographic apparatus; and
    configure, based on the model, the portion of the patterning device pattern.

16. A method to improve a lithographic process for imaging a portion of a patterning device pattern onto a substrate using a lithographic projection apparatus comprising an illumination system and projection optics, the method comprising:
    obtaining a simulation model that models projection of radiation by the projection optics, wherein the simulation model models an anamorphic demagnification of radiation by the projection optics; and
    configuring, using an objective function taking an input from the model and by a hardware computer, the portion of the patterning device pattern, the objective function having an anamorphic manufacturing rule or anamorphic manufacturing rule ratio as a penalty thereto.

17. The method of claim 16, wherein the configuring takes into account an anamorphic manufacturing rule having differing geometric limits or permissions for different directions in a plane of the patterning device pattern.

18. The method of claim 16, wherein the configuring takes into account an anamorphic manufacturing rule ratio that is used in combination with an isomorphic manufacturing rule specifying the same geometric limits or permissions for all directions in a plane of the patterning device pattern.

19. A computer program product comprising a non-transitory computer readable medium having instructions therein, the instructions, upon execution by a computer system, configured to cause the computer system to at least:
    obtain a simulation model that models projection of radiation by projection optics of a lithographic projection apparatus for imaging a portion of a patterning device pattern onto a substrate, wherein the simulation model models an anamorphic demagnification of radiation by the projection optics; and
    configure, using an objective function taking an input from the model, the portion of the patterning device pattern, the objective function having an anamorphic manufacturing rule or anamorphic manufacturing rule ratio as a penalty thereto.

* * * * *